United States Patent
Lin et al.

(10) Patent No.: US 10,692,786 B1
(45) Date of Patent: Jun. 23, 2020

(54) SEMICONDUCTOR STRUCTURES

(71) Applicant: Vanguard International Semiconductor Corporation, Hsinchu (TW)

(72) Inventors: Ting-You Lin, Hsinchu (TW); Chi-Li Tu, Cyonglin Township, Hsinchu County (TW); Shin-Cheng Lin, Tainan (TW); Yu-Hao Ho, Keelung (TW); Cheng-Tsung Wu, Taipei (TW)

(73) Assignee: Vanguard International Semiconductor Corporation, Hsinchu (TW)

(*) Notice: Subject to any disclaimer, the term of this patent is extended or adjusted under 35 U.S.C. 154(b) by 0 days.

(21) Appl. No.: 16/368,086

(22) Filed: Mar. 28, 2019

(51) Int. Cl.
| H01L 23/52 | (2006.01) |
| H01L 23/10 | (2006.01) |
| H01L 23/522 | (2006.01) |
| H01L 23/00 | (2006.01) |
| H01L 23/055 | (2006.01) |

(52) U.S. Cl.
CPC ............ *H01L 23/10* (2013.01); *H01L 23/055* (2013.01); *H01L 23/5226* (2013.01); *H01L 23/562* (2013.01)

(58) Field of Classification Search
CPC ......... H01L 23/10; H01L 23/52; H01L 23/58; H01L 23/544; H01L 23/48; H01L 23/055; H01L 23/562; H01L 23/5226
USPC ....................................................... 257/710
See application file for complete search history.

(56) References Cited

U.S. PATENT DOCUMENTS

2008/0299708 A1* 12/2008 Tsutsue ................. H01L 23/562
438/121
2014/0235030 A1* 8/2014 Disney ................ H01L 21/2654
438/418

FOREIGN PATENT DOCUMENTS

| CN | 101615598 A | 12/2009 |
| TW | 200536053 A | 11/2005 |

OTHER PUBLICATIONS

Taiwanese Office Action and Search Report for Taiwanese Application No. 108105225, dated Sep. 20, 2019.

* cited by examiner

*Primary Examiner* — Chuong A Luu
(74) *Attorney, Agent, or Firm* — Birch, Stewart, Kolasch & Birch, LLP

(57) ABSTRACT

A semiconductor structure includes a substrate, a first insulating layer, a second insulating layer, a first seal ring structure, a second seal ring structure, and a passivation layer. The substrate has a chip region and a seal ring region. The first insulating layer is on the substrate. The second insulating layer is on the first insulating layer. The first seal ring structure is in the seal ring region and embedded in the first insulating layer and the second insulating layer, wherein the first seal ring structure includes a stack of metal layers. The second seal ring structure is in the seal ring region and embedded in the first insulating layer, wherein the second seal ring structure includes a polysilicon ring structure. The passivation layer is on the second insulating layer and the first seal ring structure.

23 Claims, 17 Drawing Sheets

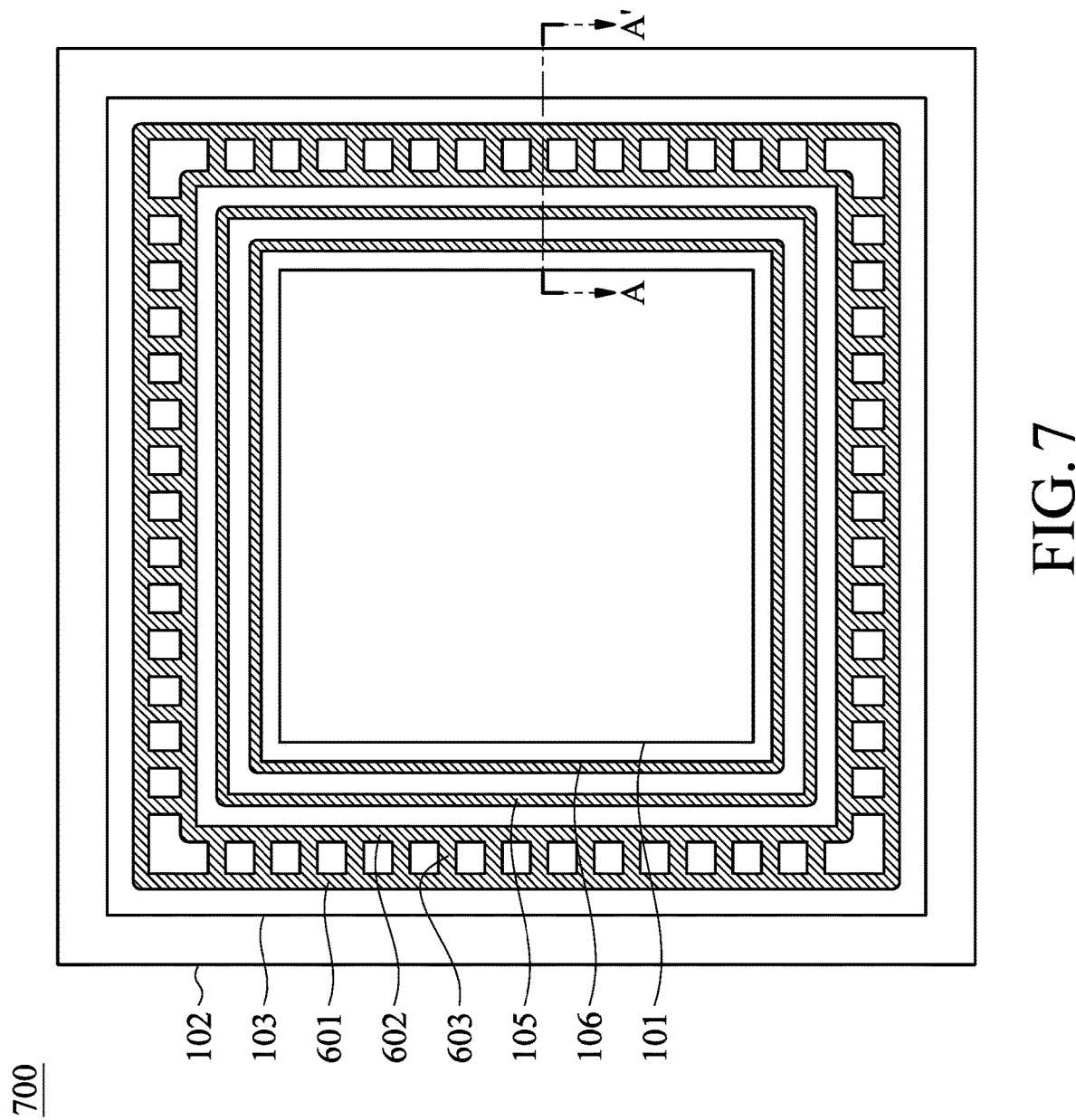

SEMICONDUCTOR STRUCTURES

BACKGROUND

Technical Field

The disclosure relates to a semiconductor structure, and more particularly to a chip seal ring structure.

Description of the Related Art

In semiconductor manufacturing processes, a plurality of dies including integrated circuits (ICs) can be fabricated simultaneously on a semiconductor wafer. A seal ring structure may be disposed between each two adjacent dies to protect the dies, so that the seal ring structure can protect the integrated circuit in the dies from being damaged in the subsequent dicing process.

Generally, the dies that include the integrated circuit on the semiconductor wafer are surrounded by a sealing ring structure to isolate the individual dies. During the dicing process, the sealing ring structure can prevent the integrated circuit in the die from being negatively affected by external stress and subsequent microcracks, preventing the invasion of moisture or chemical contaminants, and preventing electrostatic discharge (ESD) from impacting the die.

While existing seal ring structures have been generally adequate for their intended purposes, they have not been satisfactory in all respects. There is a particular need for further improvements in the protection that the seal ring structure provides for the dies in semiconductor wafers.

SUMMARY

In one embodiment of the present disclosure, a semiconductor structure is provided, wherein the semiconductor structure includes a substrate, a first insulating layer, a second insulating layer, a first seal ring structure, a second seal ring structure, and a passivation layer. The substrate has a chip region and a seal ring region. The first insulating layer is disposed on the substrate. The second insulating layer is disposed on the first insulating layer. The first seal ring structure is disposed in the seal ring region and embedded in the first insulating layer and the second insulating layer, wherein the first seal ring structure comprises a stack of metal layers. The second seal ring structure is disposed in the seal ring region and embedded in the first insulating layer, wherein the second seal ring structure comprises a polysilicon ring structure. The passivation layer is disposed on the second insulating layer and the first seal ring structure. From a top view, the seal ring region surrounds the chip region, wherein the second seal ring structure surrounds the chip region and the first seal ring structure surrounds the second seal ring structure.

In one embodiment of the present disclosure, a semiconductor structure is provided, wherein the semiconductor structure includes a substrate, an insulating layer, an outer seal ring structure, an inner seal ring structure, and a passivation layer. The substrate has a chip region and a seal ring region. The insulating layer is disposed on the substrate. The outer seal ring structure is disposed in the seal ring region and embedded in the insulating layer, wherein the outer seal ring structure comprises a stack of first metal layers. The inner seal ring structure is disposed in the seal ring region and embedded in the insulating layer, wherein the inner seal ring structure comprises a stack of second metal layers. The passivation layer is disposed on the outer seal ring structure and the inner seal ring structure. From a top view, the seal ring region surrounds the chip region, wherein the inner seal ring structure surrounds the chip region and the outer seal ring structure surrounds the inner seal ring structure, and the outer seal ring structure and the inner seal ring structure form an H-shaped ring structure by a plurality of block-shaped connecting portions.

In one embodiment of the present disclosure, a semiconductor structure is provided, wherein the semiconductor structure includes a substrate, a first insulating layer, a second insulating layer, an outer seal ring structure, an inner seal ring structure, a polysilicon ring structure, and a passivation layer. The substrate has a chip region and a seal ring region. The first insulating layer is disposed on the substrate. The second insulating layer is disposed on the first insulating layer. The outer seal ring structure is disposed in the seal ring region and embedded in the first insulating layer and the second insulating layer, wherein the outer seal ring structure comprises a stack of first metal layers. The inner seal ring structure is disposed in the seal ring region and embedded in the first insulating layer and the second insulating layer, wherein the inner seal ring structure comprises a stack of second metal layers, wherein the outer seal ring structure and the inner seal ring structure form an H-shaped ring structure by a plurality of block-shaped connecting portions. The polysilicon ring structure is disposed in the seal ring region and embedded in the first insulating layer. The passivation layer is disposed on the second insulating layer, the outer seal ring structure, and the inner seal ring structure. From a top view, the seal ring region surrounds the chip region, wherein the polysilicon ring structure surrounds the chip region, and the H-shaped ring structure surrounds the polysilicon ring structure.

BRIEF DESCRIPTION OF THE DRAWINGS

Aspects of this disclosure are best understood from the following detailed description when read with the accompanying figures. It should be noted that, in accordance with common practice in the industry, various features are not drawn to scale. In fact, the dimensions of the various features may be arbitrarily increased or reduced for clarity of discussion.

FIG. 2-1 is a top-view diagram illustrating a portion of an exemplary semiconductor structure according to some embodiments of the present disclosure.

FIG. 2-2 is a top-view diagram corresponding to a cross-section of a portion of an exemplary semiconductor structure according to some embodiments of the present disclosure.

FIG. 2A-1 is a cross-sectional diagram illustrating a semiconductor structure along the line segment A-A' shown in FIG. 2-1 according to some embodiments of the present disclosure.

FIG. 2A-2 is a cross-sectional diagram illustrating a semiconductor structure along the line segment A-A' shown in FIG. 2-1 according to other embodiments of the present disclosure.

FIG. 2A-3 is a cross-sectional diagram illustrating a semiconductor structure along the line segment A-A' shown in FIG. 2-1 according to other embodiments of the present disclosure.

FIG. 3 is a top-view diagram illustrating a portion of an exemplary semiconductor structure according to other embodiments of the present disclosure.

FIG. 7 is a top-view diagram illustrating a portion of an exemplary semiconductor structure according to yet other embodiments of the present disclosure.

DETAILED DESCRIPTION

Figure 1:
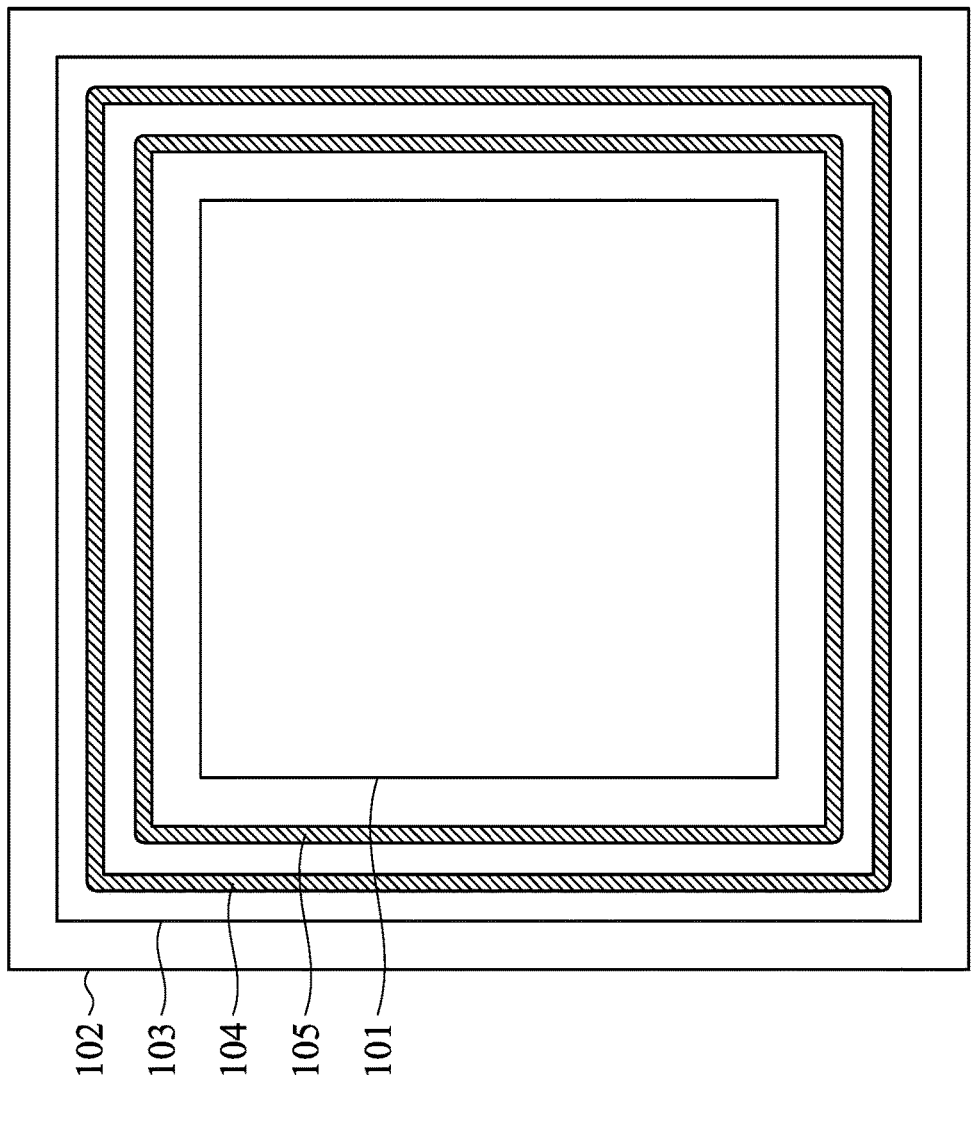
FIG. 1 is a top-view diagram illustrating a portion of an exemplary semiconductor structure according to some embodiments of the present disclosure.

The following disclosure provides many different embodiments, or examples, for implementing different features of the subject matter provided. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "over", "below," "lower," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented and the spatially relative descriptors used herein may likewise be interpreted accordingly.

The terms "about", "approximately", and "substantially" used herein generally refer to the value of an error or a range within 20 percent, preferably within 10 percent, and more preferably within 5 percent, within 3 percent, within 2 percent, within 1 percent, or within 0.5 percent. If there is no specific description, the values mentioned are to be regarded as an approximation that is an error or range expressed as "about", "approximate", or "substantially".

Although some embodiments are discussed with operations performed in a particular order, these operations may be performed in another logical order. Additional features can be provided to the semiconductor structures in embodiments of the present disclosure. Some of the features described below can be replaced or eliminated for different embodiments.

The present disclosure provides embodiments of a semiconductor structure which includes a seal ring region disposed between a chip region and a scribe line region, wherein the seal ring region includes a seal ring structure surrounding the chip region. In an embodiment of the present disclosure, a polysilicon ring structure serves as a seal ring to prevent mechanical damage to the dies during the dicing process and prevent the invasion of moisture and chemical contaminants, and thus the seal ring structure's protection of the dies can be effectively enhanced, and the area of the seal ring region can be reduced further.

First, please refer to FIG. 1, which is a top-view diagram illustrating a portion of an exemplary semiconductor structure 100 according to an embodiment of the present disclosure. According to some embodiments of the present disclosure, the semiconductor structure 100 includes a chip region 101, a seal ring region 103 surrounding the chip region 101, and a scribe line region 102 surrounding the seal ring region 103. The chip region 101 can be used to form various semiconductor components therein. For example, the semiconductor components may include such as transistors, diodes, or other active components. The semiconductor components may also include such as resistors, capacitors, inductors, or other passive components. The seal ring region 103 can be used to form one or more seal ring structures therein, wherein the seal ring structures are used to protect the inner structures of dies. A dicing process can be performed in the scribe line region 102 on the wafer. As shown in FIG. 1, the seal ring region 103 includes a first seal ring structure 104 and a second seal ring structure 105, where the first seal ring structure 104 includes a stack of metal layers and the second seal ring structure 105 includes a polysilicon ring structure. From a top view, according to some embodiments of the present disclosure, the second seal ring structure 105 surrounds the chip region 101 and the first seal ring structure 104 surrounds the second seal ring structure 105.

Figures 1, 2:
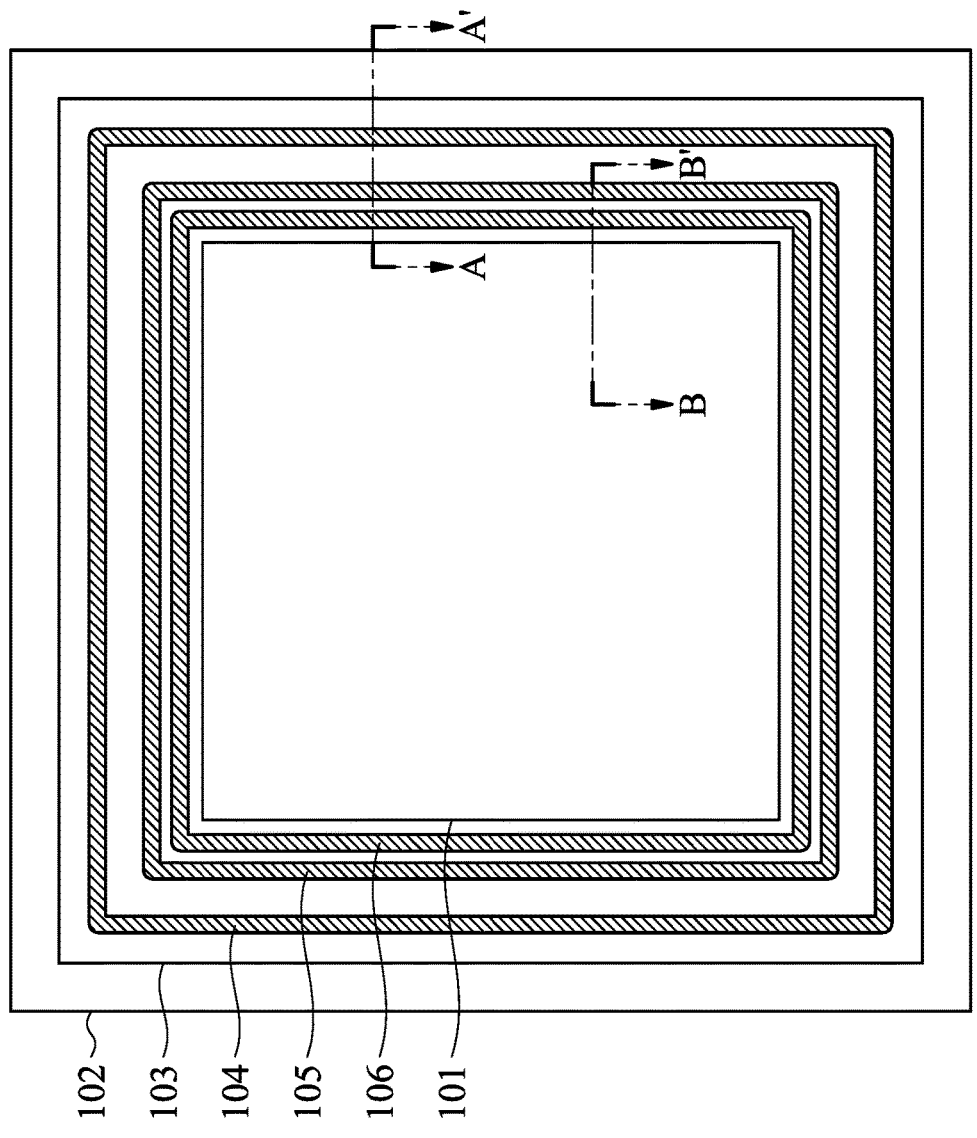
Figure 2:
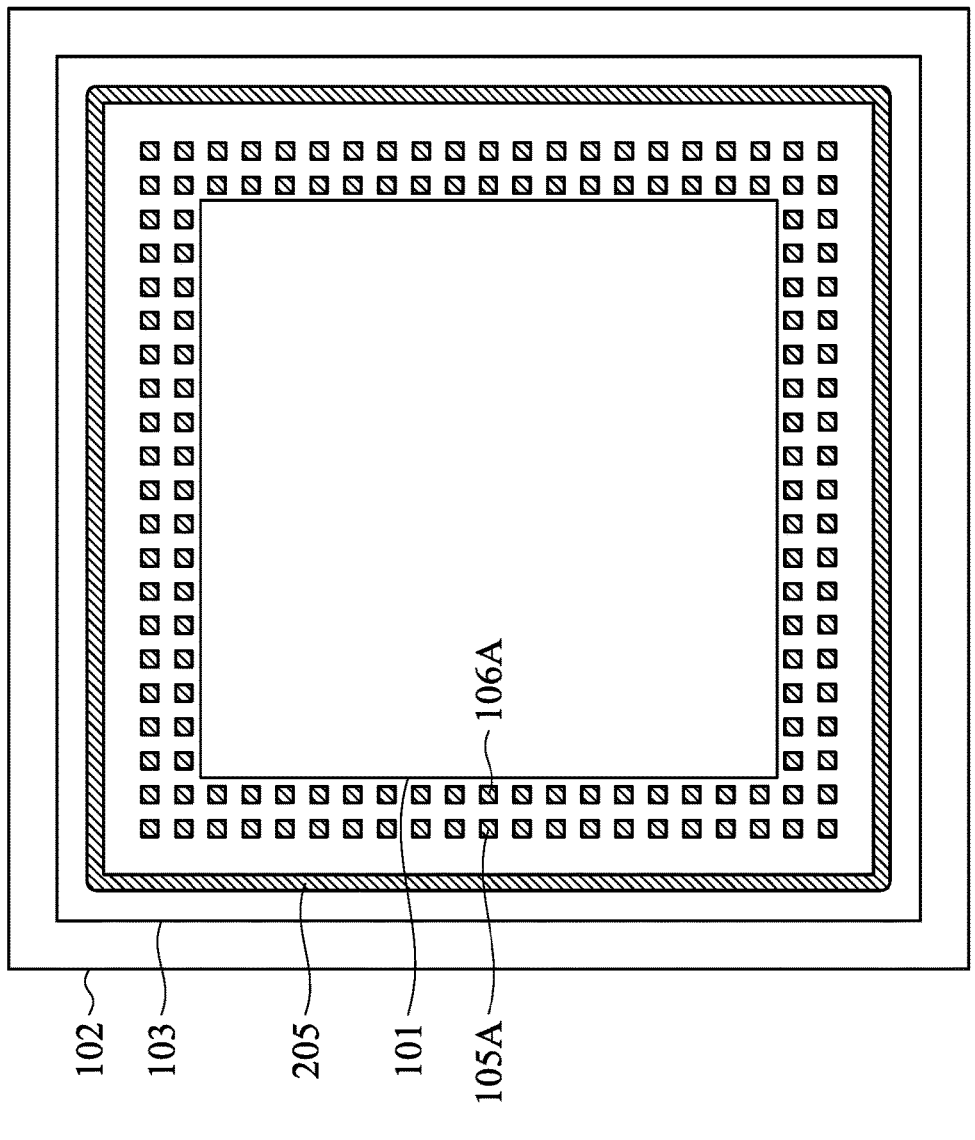

FIG. 2-1 is a top-view diagram illustrating a portion of an exemplary semiconductor structure 200, according to some embodiments of the present disclosure. In some embodiments, the difference between FIG. 2-1 and FIG. 1 is that the seal ring region 103 shown in FIG. 2-1 includes two second seal ring structures 105, 106 having polysilicon ring structures. It should be noted that although there are merely one first seal ring structure 104 and two second seal ring structures 105, 106 illustrated in FIG. 2-1, the numbers of the first seal ring structure 104 and the second seal ring structure 105 included in the embodiments of the present disclosure are not limited thereto.

Figures 1, 2A:
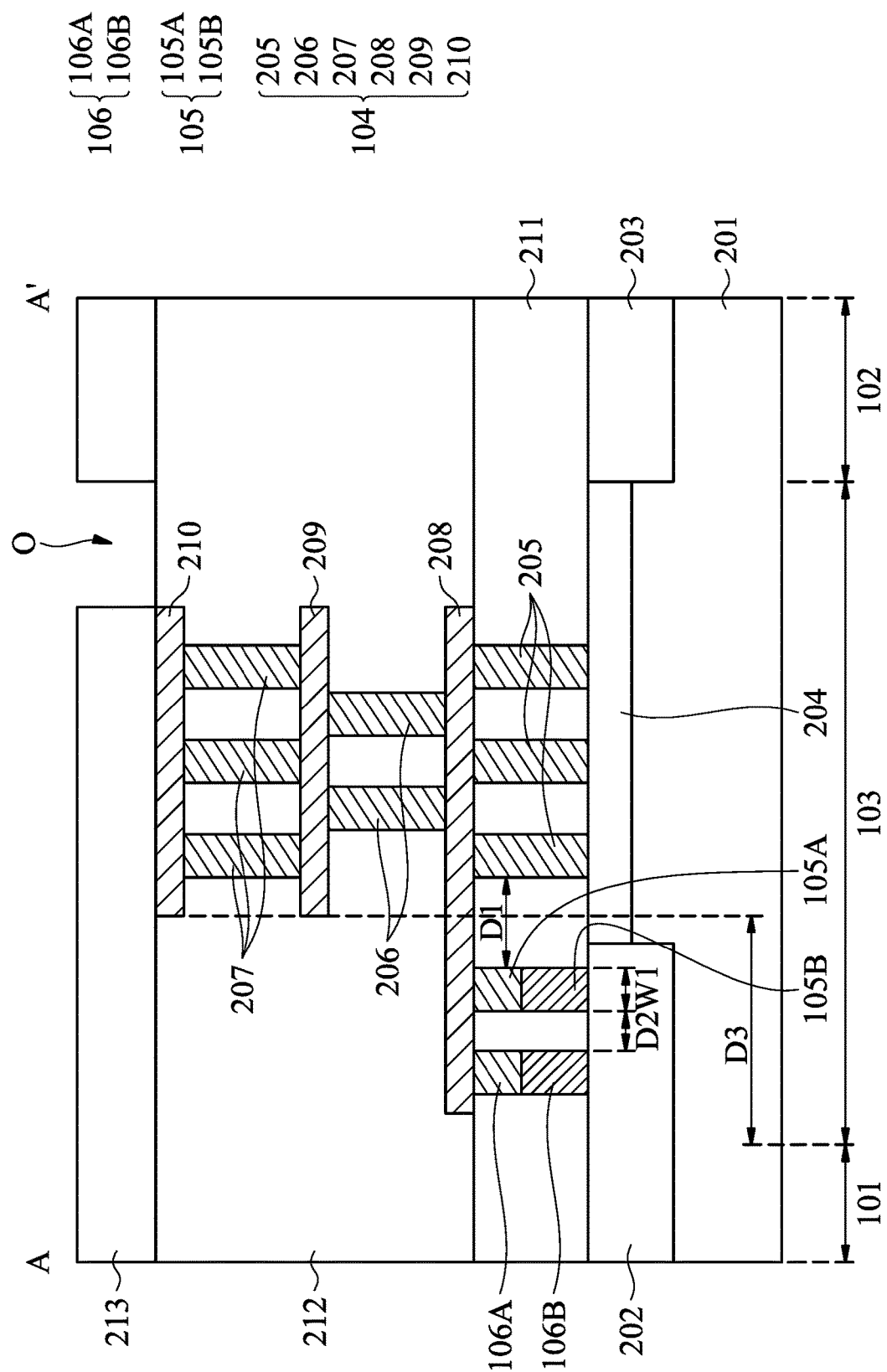
Figures 2, 2A:
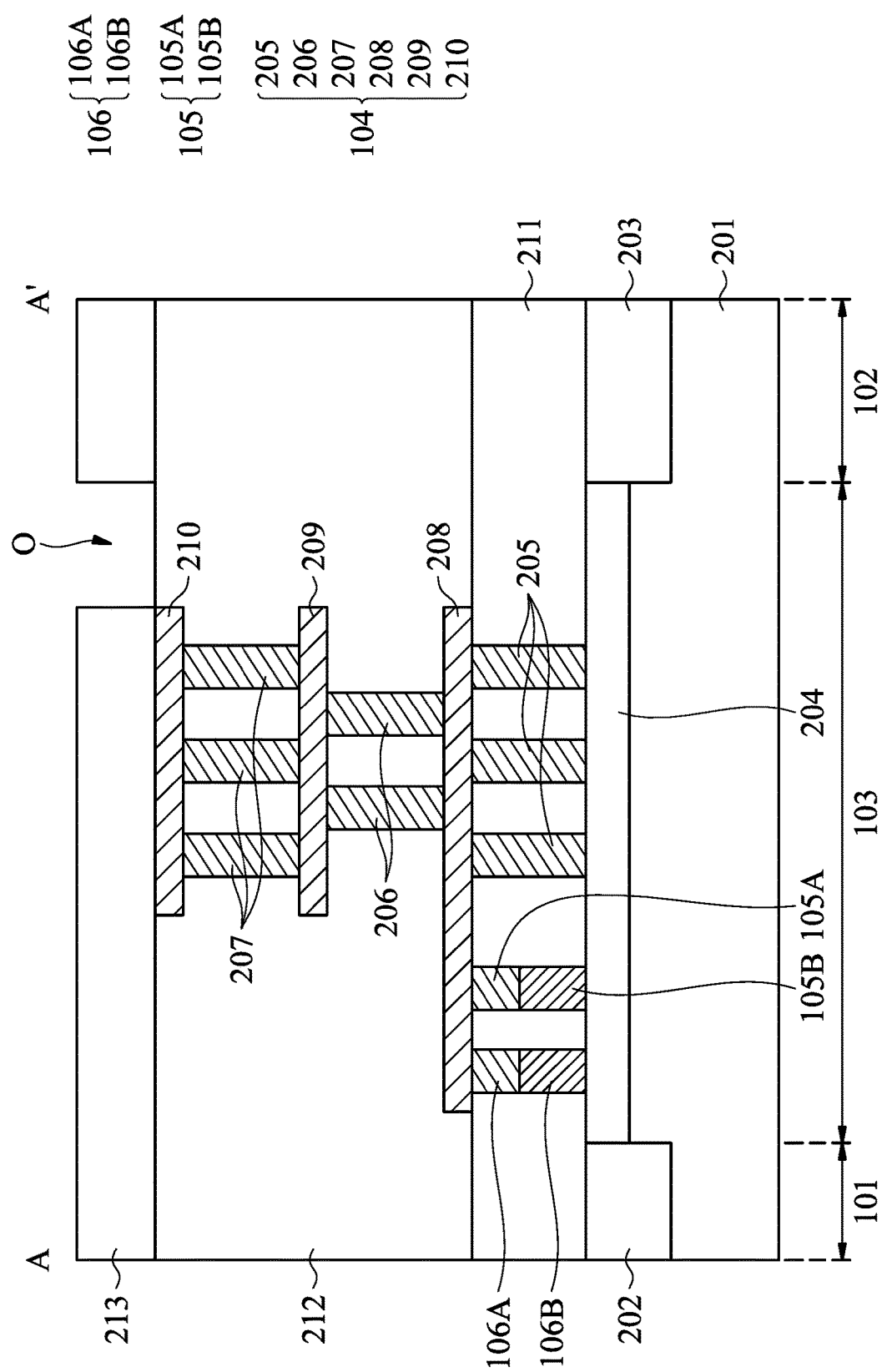
Figures 2, 2A, 3:
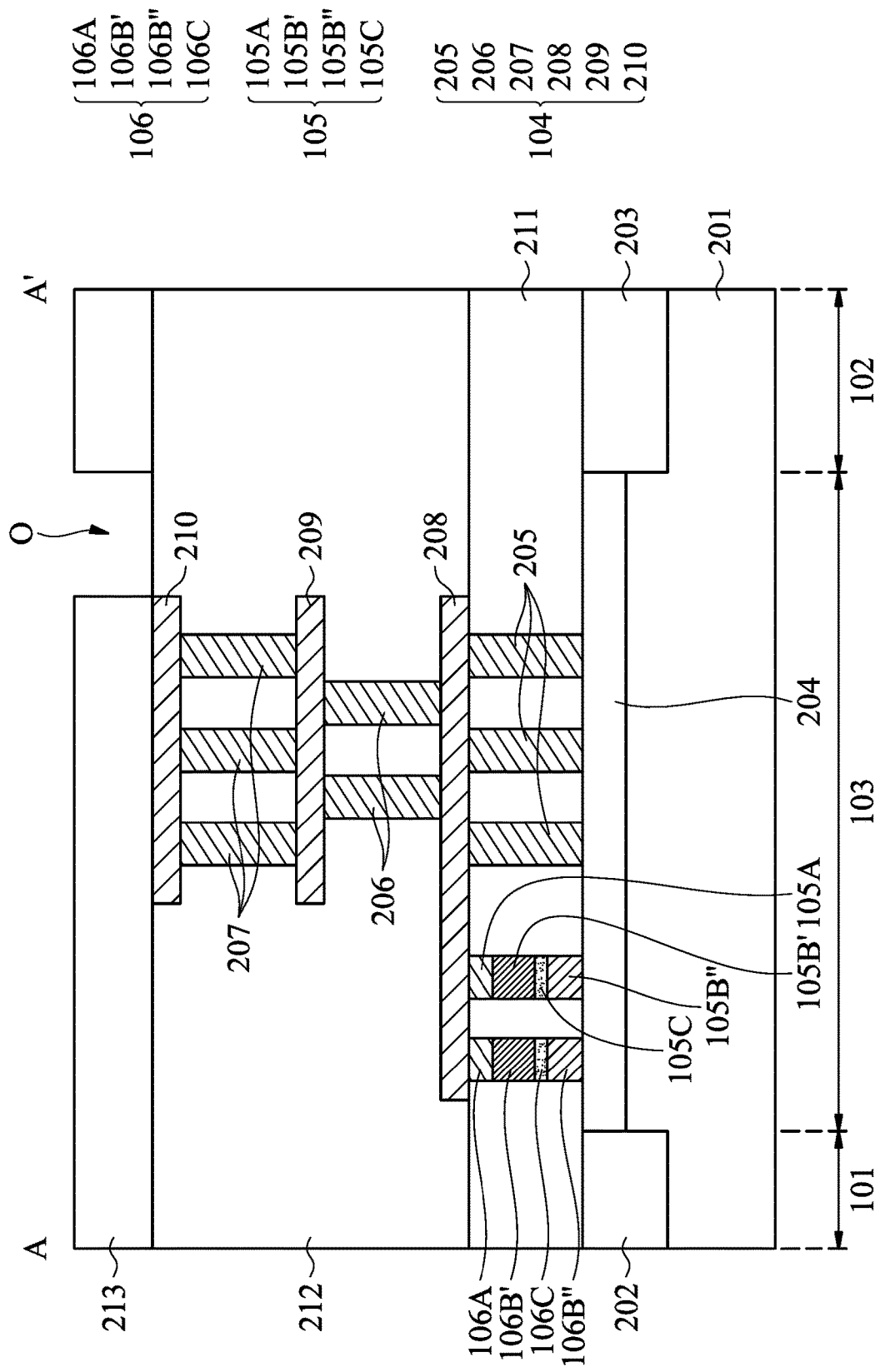
Figure 2B:
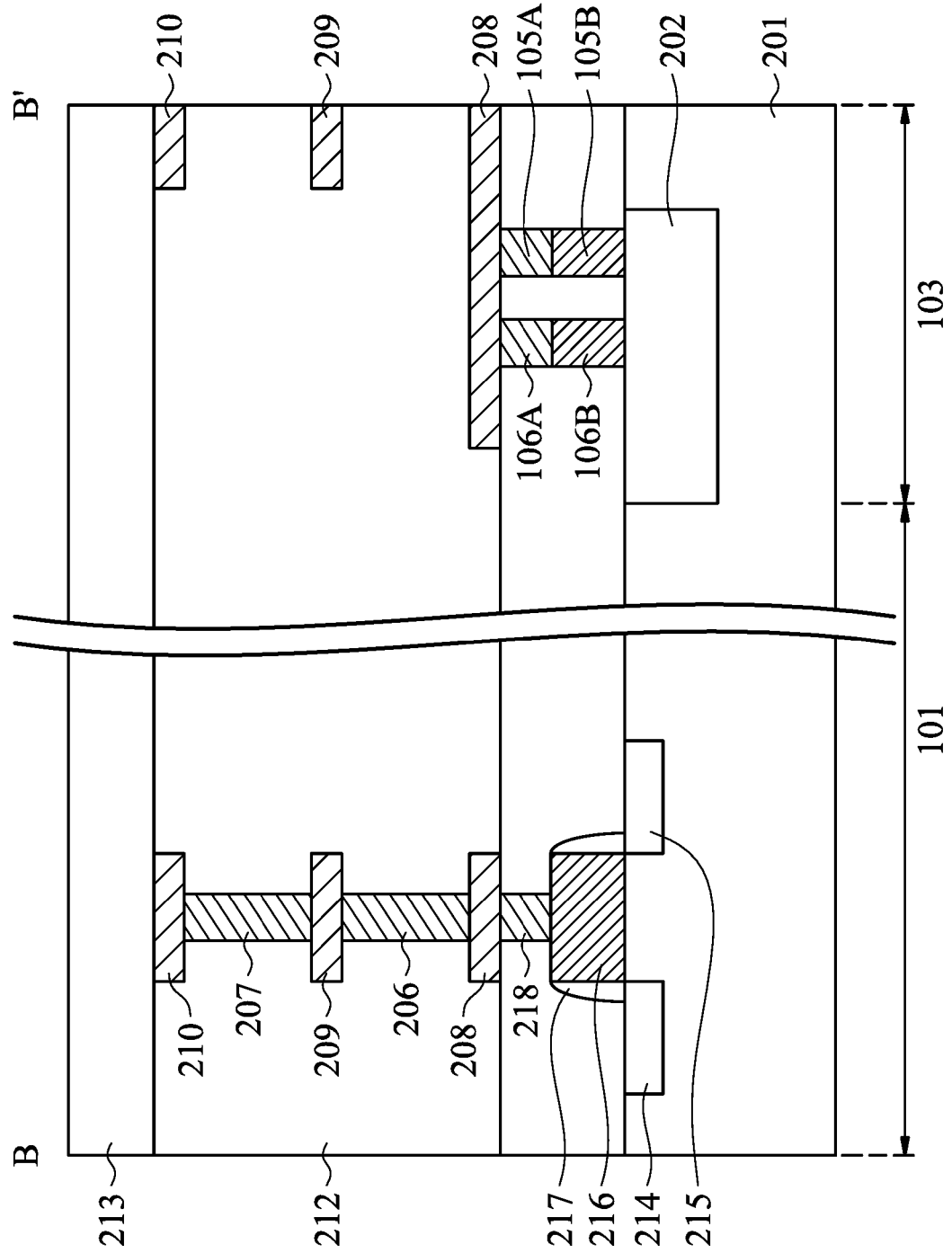
FIG. 2B is a cross-sectional diagram illustrating a semiconductor structure along the line segment B-B' shown in FIG. 2-1 according to some embodiments of the present disclosure.
Figure 3:
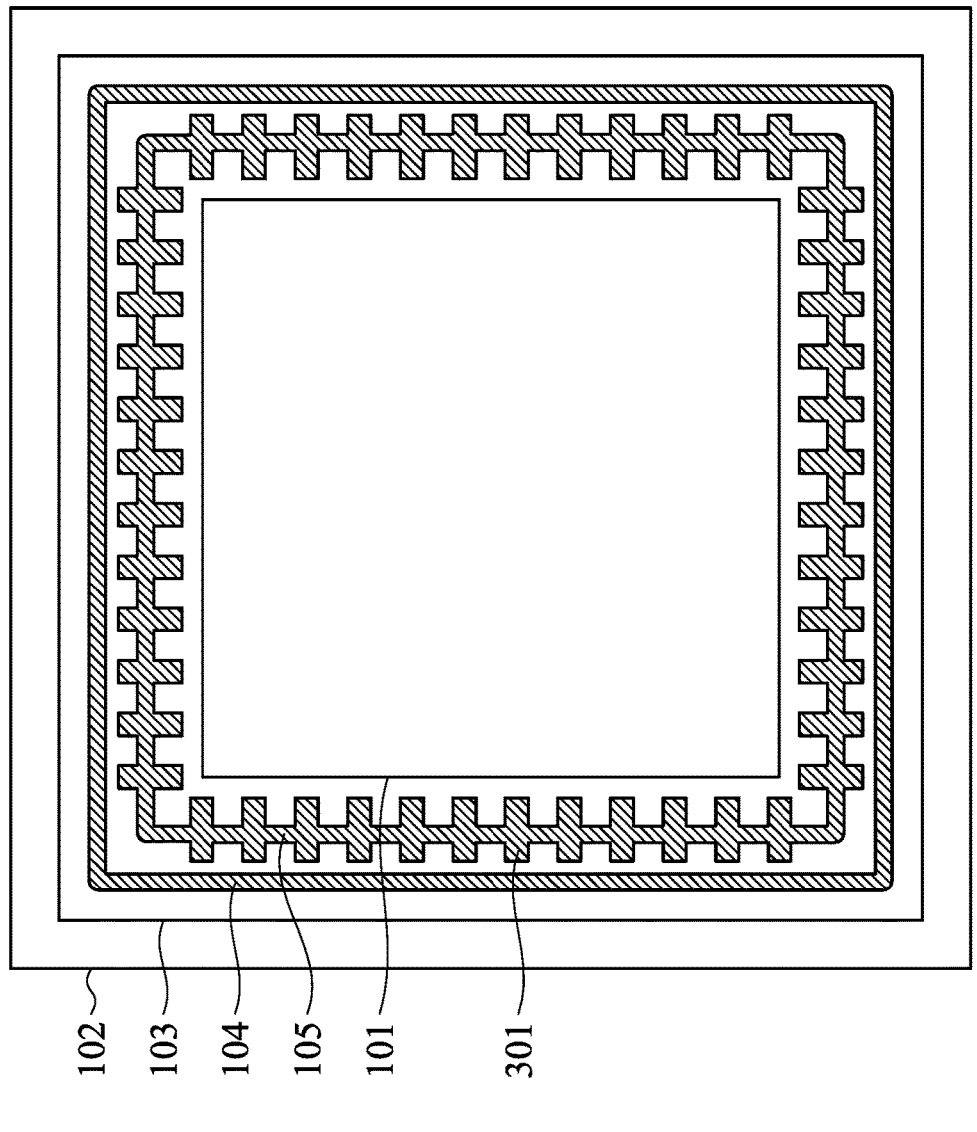

Next, please refer to FIG. 2-1 along with FIGS. 2-2, 2A-1, 2A-2, 2A-3, and 2B. FIG. 2-2 illustrates a top-view diagram corresponding to a cross-section of a portion of an exemplary semiconductor structure 200. FIGS. 2A-1, 2A-2, and 2A-3 are a cross-sectional diagram along the line segment A-A' shown in FIG. 2-1, according to various embodiments of the present disclosure. FIG. 2B is a cross-sectional diagram along the line segment B-B' shown in FIG. 2-1. It should be noted that FIGS. 2-2, 2A-1, 2A-2, 2A-3, and 2B do not illustrate all of the elements of a semiconductor 200 for the purpose of simplicity and clarity.

As shown in the cross-sectional diagram of FIG. 2A-1 and the top-view diagram of FIG. 2-1, according to some embodiments of the present disclosure, the substrate 201 can be divided into the chip region 101, the seal ring region 103, and the scribe line region 102. In some embodiments, the substrate 201 may be a semiconductor substrate, such as a silicon substrate, but the embodiments of the present disclosure is not limited thereto. For example, the substrate 201 may be an elemental semiconductor including germanium, a compound semiconductor including gallium nitride, silicon carbide, gallium arsenide, gallium phosphide, indium phosphide, indium arsenide, and/or indium antimonide, an alloy semiconductor including SiGe, GaAsP, AlInAs, AlGaAs, GaInAs, GaInP, and/or GaInAsP, or a combination thereof. In other embodiments, the substrate 201 may also be a semiconductor on insulator substrate, the semiconductor on insulator substrate may include a substrate, a buried oxide layer disposed on the substrate, and a semiconductor layer disposed on the buried oxide layer. In addition, the conductivity type of the substrate 201 may be N-type or P-type.

In some embodiments, an isolation structure 202 can be included in the substrate 201 to define the chip region 101 and to electrically isolate the semiconductor components (not shown) in or on the chip region 101 of the substrate 201. In addition, an isolation structure 203 may also be included in the substrate 201 to separate the seal ring region 103 and the scribe line region 102. In some embodiments, the isolation structures 202, 203 may include shallow trench isolation (STI) structures, local oxidation of silicon (LOCOS) structures, other suitable isolation features, or a combination thereof. The materials of the isolation structures 202, 203 may include silicon dioxide, nitrogen-doped silicon oxide, silicon nitride, silicon oxynitride, or other similar materials.

In some embodiments, the substrate 201 in the seal ring region 103 may include a doped region 204 near the upper surface of the substrate 201, and the doped region 204 is disposed between the isolation structure 202 and the isolation structure 203. The conductivity type of the doped region 204 may depend on the circuit layout inside the chip region 101. In some embodiments, the doped region 204 may be p-type, and the dopant of which may be such as B, Al, Ga, In, $BF^{3+}$ ions, or a combination thereof. In other embodiments, the doped region 204 may be n-type, and the dopant of which may be such as P, As, N, Sb ions, or a combination thereof.

As shown in FIG. 2A-1, an interlayer dielectric (ILD) layer 211 is disposed on the substrate 201 and covers the isolation structures 202, 203, and the doped region 204. There are one or more inter-metal dielectric (IMD) layers 212 disposed on the interlayer dielectric layer 211. It should be noted that only a single inter-metal dielectric layer 212 is illustrated in the FIG. 2A-1, but the number of layers included in the inter-metal dielectric layer 212 is not limited thereto.

In some embodiments, the interlayer dielectric layer 211 and the inter-metal dielectric layer 212 may be made of the same or different materials. For example, the materials of the interlayer dielectric layer 211 and the inter-metal dielectric layer 212 may respectively include single layer or multilayers of dielectric materials, such as silicon oxide, silicon nitride, silicon oxynitride, tetraethoxysilane (TEOS), phosphosilicate glass (PSG), borophosphosilicate glass (BPSG), low-k dielectric materials, and/or other suitable dielectric materials. The low-k dielectric materials may include fluorinated silica glass (FSG), hydrogen silsesquioxane (HSQ), carbon-doped siliconoxide, amorphous fluorinated carbon, parylene, bis-benzocyclobutenes (BCB), or polyimide, but not limited thereto. For example, the interlayer dielectric layer 211 and one or more inter-metal dielectric layers 212 may be formed by spin coating, chemical vapor deposition (CVD), physical vapor deposition (PVD), atomic layer deposition (ALD), high density plasma CVD (HDPCVD), other suitable methods, or a combination thereof.

The interlayer dielectric layer 211 is used to isolate the semiconductor components and metal layers on the substrate, and the inter-metal dielectric layer 212 is used to isolate the metal layers of different layers. According to the embodiments of the present disclosure, although the interlayer dielectric layer 211 and the inter-metal dielectric layer 212 may include the same material, the boundary between the interlayer dielectric layer 211 and the inter-metal dielectric layer 212 may be defined by using the lower surface of the bottommost metal layer 208 (i.e. the first layer of metal wires, or so-call "Metal 1") as a baseline. In some embodiments, the interlayer dielectric layer 211 is defined as the dielectric layer below the lower surface of the bottommost metal layer 208, and the inter-metal dielectric layer 212 is defined as the dielectric layer above the lower surface of the bottommost metal layer 208.

In the seal ring region 103 illustrated in FIG. 2A-1, the first seal ring structure 104, the second seal ring structure 105, and the second seal ring structure 106 are arranged sequentially and in order toward the chip region 101 in the seal ring region 103. According to some embodiments of the present disclosure, as shown in FIG. 2A-1, the first seal ring 104 may include a stack of metal layers which consists of a plurality of first contacts 205, a plurality of vias 206, 207, and metal layers 208, 209, and 210. The second seal ring structure 105 may include a polysilicon ring structure 105B and a second contact 105A disposed on the polysilicon ring structure 105B. The second seal ring structure 106 may include a polysilicon ring structure 106B and a second contact 106A disposed on the polysilicon ring structure 106B.

Subsequently, in order to more clearly describe the shape of the vias and the contacts, please refer to FIG. 2A-1 along with FIG. 2-2, which is the top-view diagram corresponding to a cross-section of a portion of the exemplary semiconductor structure 200. It should be noted that FIG. 2-2 mainly illustrates the cross-sectional shape of the vias and the contacts to highlight the technical features of the present disclosure, and not all the elements of the semiconductor structure 200 are illustrated in FIG. 2-2. According to some embodiments of the present disclosure, the cross-sections of the plurality of first contacts 205 and/or the plurality of vias 206, 207 included in the first seal ring structure 104 may be ring-shaped vias from a top view. The contour of the ring-shaped via may be substantially similar to the ring-shaped contour of the first seal ring structure 104 illustrated in FIG. 2-1. For the purpose of simplicity and clarity, the vias 206, 207 are not illustrated in FIG. 2-2, and the contours of the vias 206, 207 may be substantially the same as the ring-shaped contour of the first contact 205. In some embodiments, the second contacts 105A, 106A included in the second seal ring structures 105, 106 are discrete ring-like vias. Specifically, the discrete ring-like vias in the top-view diagram corresponding to a cross-section illustrated FIG. 2-2 has a ring-like contour composed of discrete vias. It should be noted that the shapes, numbers, and arrangements of the vias and contacts illustrated in FIG. 2-2 are merely exemplary, and the present disclosure is not limited thereto.

In some embodiments, the first contacts 205 included in the first seal ring structure 104 are embedded in the interlayer dielectric layer 211 and contact the doped region 204 of the substrate 201. The vias 206, 207, and the metal layers 208, 209, and 210 included in the first seal ring structure 104 are embedded in the inter-metal dielectric layer 212, wherein the metal layers 208, 209, and 210 are electrically connected with each other by the vias 206, 207. In some embodiments, the bottommost metal layer 208 is electrically connected to the first contacts 205. According to some embodiments of the present disclosure, by providing the doped region 204 in contact with the first contacts 205, the resistance between the first contacts 205 and the substrate 201 may be reduced. In this way, the static electricity generated during the dicing process can be effectively discharged to the substrate 201 through the first sealing ring structure 104, and thereby the impact of electrostatic discharge (ESD) on the dies can be reduced.

In some embodiments, a photolithography process, an etching process, other suitable processes, or a combination thereof may be used to form openings in the interlayer dielectric layer 211 and the inter-metal dielectric layer 212. Then, the openings are filled with conductive materials to form the first contacts 205 and the vias 206, 207. In some embodiments, the conductive materials of the first contacts 205 and the vias 206, 207 may include metal (e.g. tungsten, aluminum, or copper), metal alloy, other suitable conductive materials, or a combination thereof. For example, the conductive materials may be deposited in the openings to form the first contacts 205 and the vias 206, 207 by a process such as a physical vapor deposition (PVD) process (e.g. evaporation or sputtering), plating, an atomic layer deposition (ALD) process, other suitable processes, or a combination thereof.

In some embodiments, the metal layers 208, 209, and 210 may include Cu, W, Ag, Sn, Ni, Co, Cr, Ti, Pb, Au, Bi, Sb, Zn, Zr, Mg, In, Te, Ga, other suitable metal materials, an alloy thereof, or a combination thereof. In some embodiments, metal layers may be blanketly deposited on the interlayer dielectric layer 211 and in the inter-metal dielectric layer 212 by a process such as a physical vapor deposition (PVD) process, plating, an atomic layer deposition (ALD) process, other suitable processes, or a combination thereof. In addition, in some embodiments, the damascene process may be used to form the patterned metal layers 208, 209, and 210. It should be noted that the numbers of the first contacts, vias, and metal layers are merely exemplary, and the embodiments of the present disclosure is not limited thereto.

As shown in FIG. 2A-1, in some embodiments, the second seal ring structures 105, 106 are merely embedded in the interlayer dielectric layer 211. In other words, the second seal ring structures 105, 106 are disposed between the bottommost metal layer 208 and the substrate 201. According to some embodiments of the present disclosure, the second seal ring structures 105, 106 respectively includes the second contacts 105A, 106A, and the polysilicon ring structures 105B, 106B. In some embodiments, the polysilicon ring structures 105B, 106B are disposed on the isolation structure 202 of the substrate 201. The second contacts 105A, 106A are respectively disposed on the polysilicon ring structures 105B, 106B and merely embedded in the interlayer dielectric layer 211 without extending into the inter-metal dielectric layer 212. In some embodiments, the second contacts 105A, 106A and the first contacts 205 directly contact the bottommost metal layer 208. According to other embodiments of the present disclosure, the second seal ring structures 105, 106 do not include the second contacts 105A, 106A (not shown) which are respectively disposed on the polysilicon ring structures 105B, 106B in the aforementioned embodiments. In such cases, the top surface of the polysilicon ring structures 105B, 106B are embedded in the interlayer dielectric layer 211 without being in contact with the metal layer 208.

In some embodiments, the materials and the formation methods of the second contacts 105A, 106A are substantially the same as those of the first contacts 205 and the vias 206, 207. The details are not described again herein to avoid repetition. In some embodiments, the polysilicon ring structures 105B, 106B are made of polysilicon and may be formed by such as chemical vapor deposition (CVD) process.

As shown in FIG. 2A-1, in some embodiments, a passivation layer 213 is disposed on the inter-metal dielectric layer 212 and covers the first seal ring structure 104. The passivation layer 213 can protect the underlying layers and provide physical isolation and structural support. For example, the passivation layer 213 may include $SiO_2$, $SiN_3$, SiON, $Al_2O_3$, AN, polyimide (PI), benzocyclobutene (BCB), polybenzoxazole (PBO), other suitable materials, or a combination thereof. In some embodiments, the passivation layer 213 may be formed by chemical vapor deposition (CVD), spin-coating, other suitable methods, or a combination thereof. In some embodiments, a chemical mechanical polish (CMP) process may be performed to make the passivation layer 213 have a planar or a substantially planar top surface. In some embodiments, an opening O can be formed in the passivation layer 213 to expose the inter-metal dielectric layer 212 between the seal ring region 103 and the scribe line region 102. When performing the dicing process in the scribe line region 102, the opening O can reduce the transfer of external stress to the seal ring region 102.

According to the embodiments of the present disclosure, as shown in FIG. 2A-1, the width of the second seal ring structures 105, 106 is the first width W1. In some embodiments, the first width W1 is in a range from about 0.2 micrometers (um) to about 10 um. The width of the second seal ring structure 105 may be the same as or different from the width of the second seal ring structure 106. The distance between the first seal ring structure 104 and the second seal ring structure 105 is the first distance D1, the distance between the second seal ring structure 105 and the second seal ring structure 106 is the second distance D2, and the distance between the edge of the seal ring region 103 adjoin the chip region 101 and the edge of the metal layer 209 of the first seal ring structure 104 adjoin the chip region 101 is the third distance D3. In some embodiments, the first distance D1 is in a range from about 0.2 um to about 10 um, and the second distance D2 is also in a range from about 0.2 um to about 10 um. In some embodiments, the third distance D3 is not less than 10 um. For example, the third distance D3 is in a range from about 10 um to about 100 um. In some embodiments, the distance between the polysilicon ring structures 105B, 106B included in the second seal ring structures 105, 106 is substantially the same as the second distance D2, such as in a range from about 0.2 um to about 10 um.

In some embodiments, along the direction from the seal ring region 103 toward the chip region 101, from the first seal ring structure 104 as the starting point, a second seal ring structure may be added every 0.2 um to about 10 um.

For example, more than three second sealing ring structures can be provided (not shown). It should be noted that although FIG. 2A-1 merely illustrated two second seal ring structures 105, 106, the number of the second seal ring structures is not limited thereto. By the structure and arrangement in the seal ring region 103, in addition to preventing mechanical damage of the die during the dicing process and preventing the invasion of moisture and chemical contaminants, the internal stress which may negatively affect the interior structure during the manufacturing process can also be prevented. Therefore, the protection that the seal ring structure provides to the dies can be effectively enhanced and thereby increase the effective active area of the chip region within the seal ring structure.

Please refer to FIG. 2A-1 along with FIG. 2B. FIG. 2B is a cross-sectional diagram along the line segment B-B' of the chip region and the seal ring region shown in FIG. 2-1, according to some embodiments of the present disclosure. FIG. 2B illustrates a portion of structures in the chip region 101 and a portion of structures in the seal ring region 202, wherein details regarding the portion of structures in the seal ring region 202 can be found in the description of FIG. 2A-1. As shown in FIG. 2B, the chip region 101 includes a source region 214 and a drain region 215 disposed in the substrate 201, a gate structure 216 embedded in the interlayer dielectric layer 211, gate spacers 217 disposed on the opposite sides of the gate structure 216, and a gate contact 218 disposed on the top surface of the gate structure 216. In some embodiments, the gate contact 218 directly contacts the bottommost metal layer 208.

According to some embodiments of the present disclosure, the gate structure 216 and the polysilicon ring structures 105B, 106B are in the same level. In some embodiments, the gate structure 216 and the polysilicon ring structures 105B, 106B are formed by patterning the same polysilicon layer. In some embodiments, the materials and the formation methods of the gate contact 218 are substantially the same as those of the second contacts 105A, 106A. The gate contact 218 and the second contacts 105A, 106A may be formed simultaneously in the same process, so the details are not described again herein to avoid repetition. By forming the polysilicon ring structures 105B, 106B which are included in the second seal ring structures 105, 106 simultaneously in the formation process of gate structure, a more complete protection of the chip region 101 can be provided without adding additional process costs. In other embodiments, the materials and the formation methods of the gate structure are substantially the same as those of the metal layers 208, 209, and 210. The details are not described again herein to avoid repetition.

Subsequently, please refer to FIG. 2A-2. FIG. 2A-2 is a cross-sectional diagram along the line segment A-A' of the seal ring region shown in FIG. 2-1, according to other embodiments of the present disclosure. The difference between the structure shown in FIG. 2A-2 and the structure shown in FIG. 2A-1 is that the polysilicon ring structures 105B, 106B and the first contacts 205 are disposed on the doped region 204 of the substrate 201 in FIG. 2A-2. The structure in the seal ring region 103 illustrated in FIG. 2A-2 is substantially the same as the structure illustrated in FIG. 2A-1. Therefore, the materials and formation methods of the first seal ring structure 104 and the second seal ring structures 105, 106 are not described again herein to avoid repetition.

Subsequently, please refer to FIG. 2A-3. FIG. 2A-3 is a cross-sectional diagram along the line segment A-A' of the seal ring region shown in FIG. 2-1, according to other embodiments of the present disclosure. The difference between the structure shown in FIG. 2A-3 and the structure shown in FIG. 2A-1 is that the polysilicon ring structures 105B includes two layers of polysilicon layers 105B', 105B" and a dielectric layer 105C disposed between the polysilicon layers 105B', 105B", and the polysilicon ring structures 106B includes two layers of polysilicon layers 106B', 106B" and a dielectric layer 106C disposed between the polysilicon layers 106B', 106B". The structures of the polysilicon ring structures 105B, 106B may vary depending on the manufacturing process of the components in the active region. For example, in the embodiment which includes the process for forming multi-gate structures in the active region, the polysilicon layer 105B', the dielectric layer 105C, and the polysilicon layer 105B" included in the polysilicon ring structures 105B can be formed sequentially in accordance with the process for forming multi-gate structures, and the polysilicon layer 106B', the dielectric layer 106C, and the polysilicon layer 106B" included in the polysilicon ring structures 106B can also be formed sequentially in accordance with the process. In some embodiments, the polysilicon ring structure including two or more layers (not shown) of polysilicon layers provides better mechanical strength than the polysilicon ring structure merely including a single polysilicon layer. Thus, the protection around the chip region to isolate the internal stress and external stress can be enhanced.

In some embodiments, the materials of the dielectric layers 105C, 106C may include silicon oxide, silicon nitride, silicon oxynitride, high-k dielectric materials, other suitable materials, or a combination thereof. The dielectric layers 105C, 106C may be formed by chemical vapor deposition (CVD), atomic layer deposition (ALD), other suitable methods or a combination thereof.

FIG. 3 is a top-view diagram illustrating a portion of an exemplary semiconductor structure 300, according to other embodiments of the present disclosure. In some embodiments, the semiconductor structure 300 illustrated in FIG. 3 is substantially the same as the semiconductor structure 100 illustrated in FIG. 1, and the difference is that the polysilicon ring structures 105B included in the second seal ring structure 105 of the semiconductor structure 300 has a plurality of protruding portions 301 which protrude beyond two opposite sides of the polysilicon ring structures 105B. In some embodiments, the protruding portions 301 are formed of polysilicon, and the protruding portions 301 and the polysilicon ring structures 105B are formed simultaneously in the same process. By the arrangement of the polysilicon ring structures 105B having protruding portions 301 included in the second seal ring structure 105, the contact area between the second sealing ring structure 105 and the interlayer dielectric layer 211 can be increased, and thereby the cushioning effect to prevent the internal stress and external stress around the chip region can be enhanced.

Figure 4:
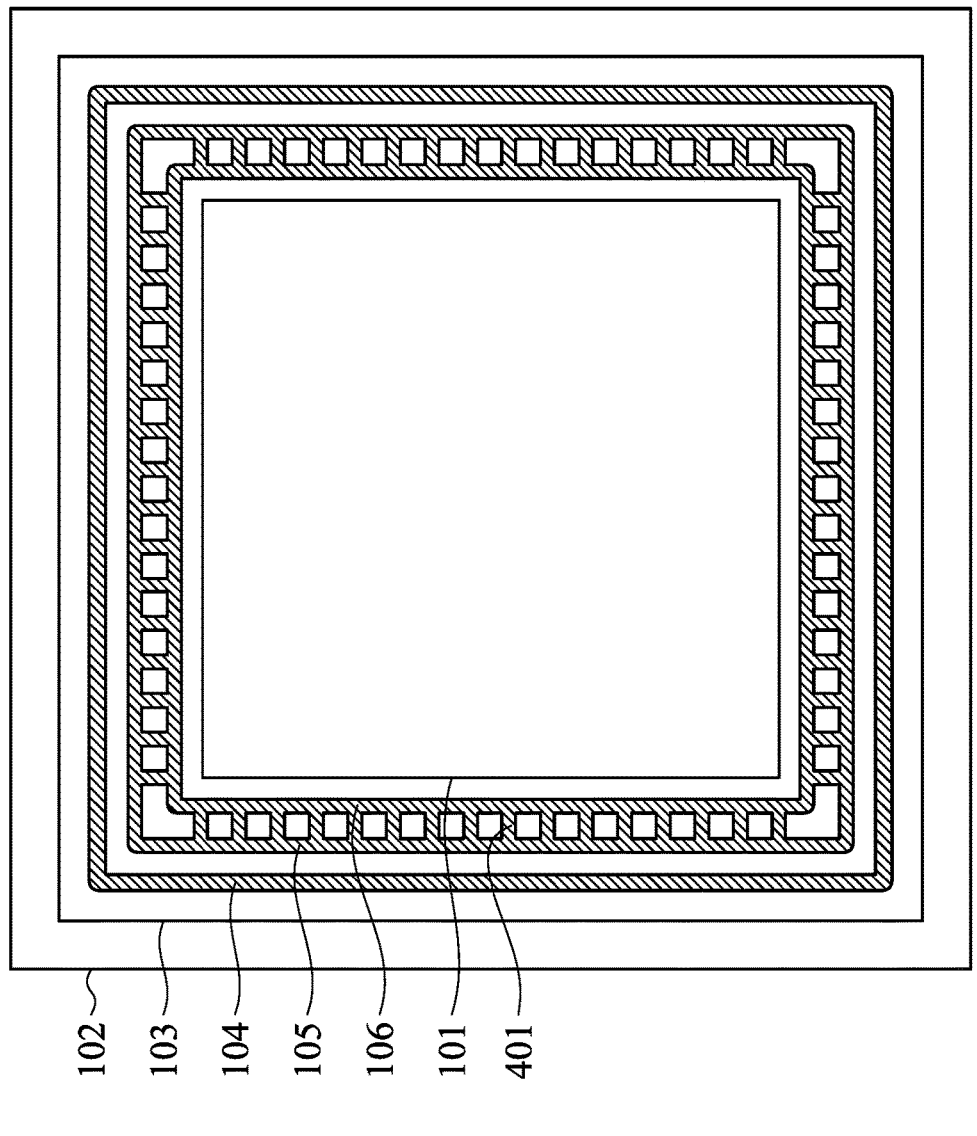
FIG. 4 is a top-view diagram illustrating a portion of an exemplary semiconductor structure according to other embodiments of the present disclosure.

FIG. 4 is a top-view diagram illustrating a portion of an exemplary semiconductor structure 400, according to other embodiments of the present disclosure. In some embodiments, the semiconductor structure 400 illustrated in FIG. 4 is substantially the same as the semiconductor structure 200 illustrated in FIG. 2-1, and the difference is that the polysilicon ring structures 105B, 106B which are included in the second seal ring structures 105, 106 are connected to each other by a plurality of block-shaped connecting portions 401 to form an H-shaped ring structure. In some embodiments, the block-shaped connecting portions 401 are formed of polysilicon, and the block-shaped connecting portions 401 and the polysilicon ring structures 105B are formed simultaneously in the same process. By the arrangement of the H-shaped ring structure of the second seal ring structures 105, 106, the second seal ring structures 105, 106 may be firmer. The contact area between the second sealing ring structures 105, 106 and the interlayer dielectric layer 211 can be increased, and thereby better mechanical strength can be provided and the cushioning effect to prevent the internal stress and external stress around the chip region can be enhanced.

Figure 5:
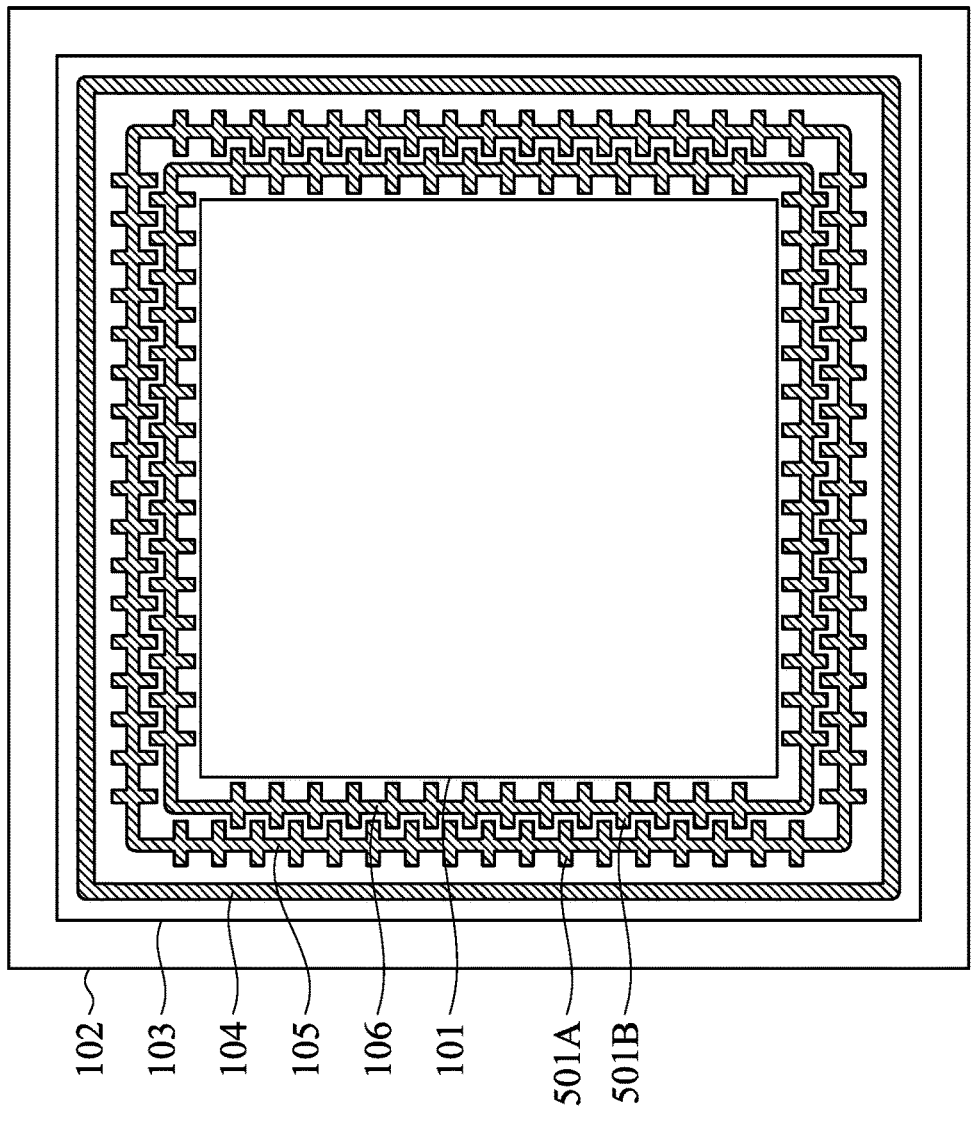
FIG. 5 is a top-view diagram illustrating a portion of an exemplary semiconductor structure according to other embodiments of the present disclosure.

FIG. 5 is a top-view diagram illustrating a portion of an exemplary semiconductor structure 500, according to other embodiments of the present disclosure. In some embodiments, the semiconductor structure 500 illustrated in FIG. 5 is substantially the same as the semiconductor structure 200 illustrated in FIG. 2-1, and the difference is that the polysilicon ring structure 105B included in the second seal ring structure 105 of the semiconductor structure 500 has a plurality of protruding portions 501A, and the polysilicon ring structure 106B included in the second seal ring structure 106 of the semiconductor structure 500 has a plurality of protruding portions 501B. The protruding portions 501A protrude beyond two opposite sides of the polysilicon ring structures 105B, and the protruding portions 501B protrude beyond two opposite sides of the polysilicon ring structures 106B. The protruding portions 501A and the protruding portions 501B are arranged in a staggered order. In some embodiments, the protruding portions 501A, 501B are formed of polysilicon, and the protruding portions 501A, 501B and the polysilicon ring structures 105B, 106B are formed simultaneously in the same process. By the arrangement of the polysilicon ring structures 105B, 106B having protruding portions 501A, 501B included in the second seal ring structures 105, 106, the contact area between the second sealing ring structures 105, 106 and the interlayer dielectric layer 211 can be increased, and thereby the isolation and the cushioning effect to prevent the internal stress and external stress around the chip region can be enhanced.

According to FIGS. 1-5, the semiconductor structures 100, 200, 300, 400, and 500 provided in the embodiments of the present disclosure include the first seal ring structure 104 and one or more second seal ring structures including the polysilicon ring structure. By the shape, structure, and arrangement of the polysilicon ring structure included in the second seal ring structure, the mechanical damage of the die during the dicing process and the invasion of moisture and chemical contaminants can be prevented. Therefore, the protection that the seal ring structure provides to the dies can be effectively enhanced and thereby increase the effective active area of the chip region within the seal ring structure.

Figure 6:
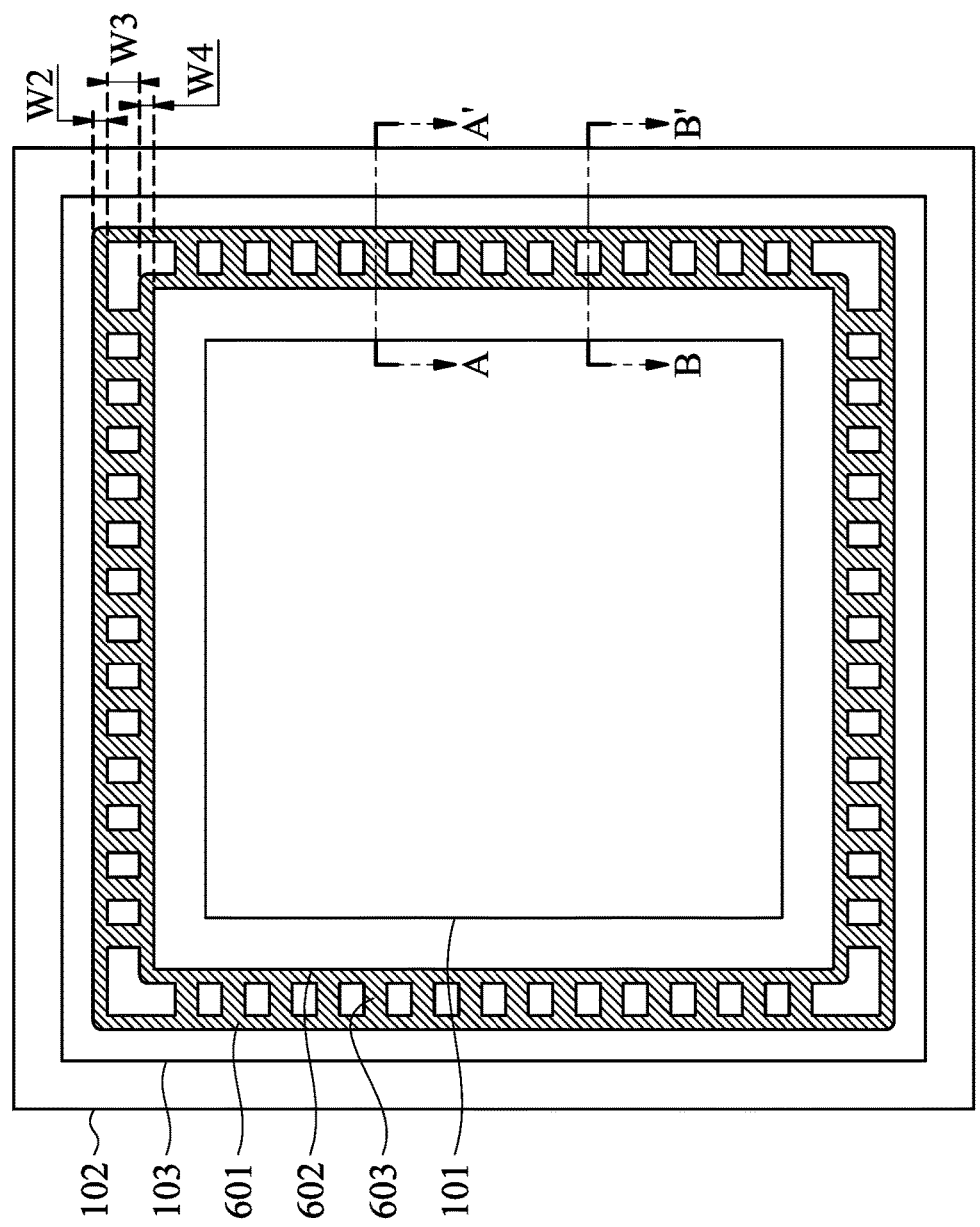
FIG. 6 is a top-view diagram illustrating a portion of an exemplary semiconductor structure according to another embodiment of the present disclosure.

Please refer to FIG. 6. FIG. 6 is a top-view diagram illustrating a portion of an exemplary semiconductor structure 600, according to another embodiment of the present disclosure. As shown in FIG. 6, the semiconductor structure 600 includes a chip region 101, a seal ring region 103 surrounding the chip region 101, and a scribe line region 102 surrounding the seal ring region 103. The seal ring region 103 includes an outer seal ring structure 601 and an inner seal ring structure 602. From a top view, according to some embodiments of the present disclosure, the inner seal ring structure 602 surrounds the chip region 101, and the outer seal ring structure 601 surrounds the inner seal ring structure 602. The outer seal ring structure 601 and the inner seal ring structure 602 form an H-shaped ring structure by a plurality of block-shaped connecting portions 603.

In some embodiments, as shown in FIG. 6, the width of the outer seal ring structure 601 is the second width W2, the width of the inner seal ring structure 602 is the fourth width W4, and the width of the block-shaped connecting portion 603 is the third width W3. In some embodiments, the second and fourth widths W1 and W2 are in a range from about 0.2 um to about 10 um, such 2 um. The third width W3 is in a range from about 0.2 um to about 10 um, such 6 um.

Figure 6A:
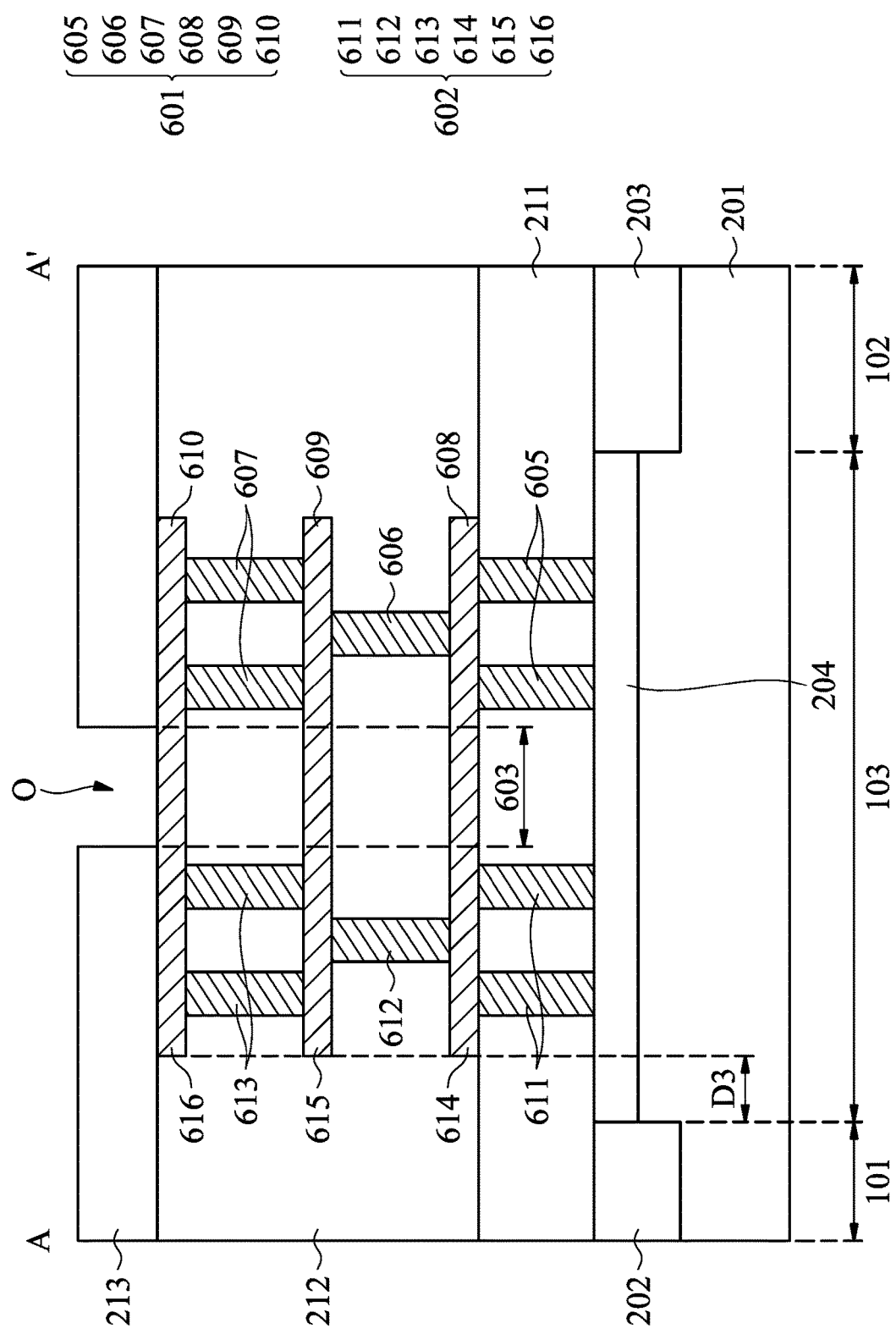
FIG. 6A is a cross-sectional diagram illustrating a semiconductor structure along the line segment A-A' shown in FIG. 6 according to another embodiment of the present disclosure.
Figure 6B:
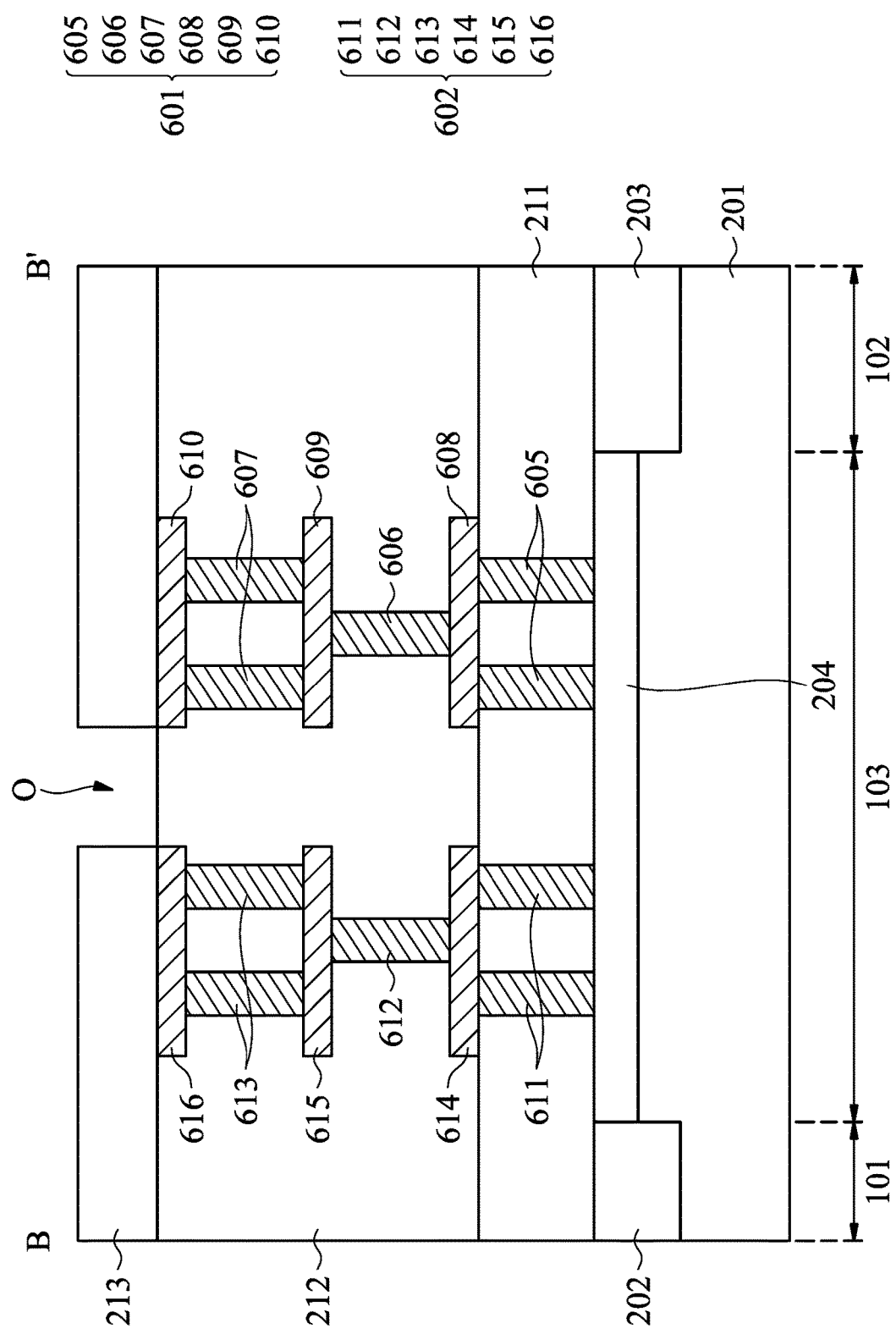
FIG. 6B is a cross-sectional diagram illustrating a semiconductor structure along the line segment B-B' shown in FIG. 6 according to another embodiments of the present disclosure.

Subsequently, please refer to FIG. 6 along with FIGS. 6A and 6B. FIG. 6A is a cross-sectional diagram along the line segment A-A' shown in FIG. 6. FIG. 6B is a cross-sectional diagram along the line segment B-B' shown in FIG. 6. It should be noted that FIGS. 6A and 6B do not illustrate all of the elements of a semiconductor 600 for the purpose of simplicity and clarity.

As shown in the cross-sectional diagram of FIG. 6A and the top-view diagram of FIG. 6, according to some embodiments of the present disclosure, the substrate 201 can be divided into the chip region 101, the seal ring region 103, and the scribe line region 102. According to the embodiment of the present disclosure, the materials and the formation methods of the substrate 201, the isolation structures 202, 203, the doped region 204, the interlayer dielectric layer 211, the inter-metal dielectric layer 212, and the passivation layer 213 illustrated in FIG. 6A are substantially the same as those of the structures shown in FIG. 2A-1. The details are not described again herein to avoid repetition.

In the seal ring region 103 illustrated in FIG. 6A, the outer seal ring structure 601 and the inner seal ring structure 602 are arranged sequentially and in order toward the chip region 101 in the seal ring region 103. As shown in FIG. 6A, in some embodiments, the outer seal ring 601 may include a first stack of metal layers which consists of a plurality of first contacts 605, a plurality of vias 606, 607, and first metal layers 608, 609, and 610. The inner seal ring structure 602 may include a second stack of metal layers which consists of a plurality of first contacts 611, a plurality of vias 612, 613, and second metal layers 614, 615, and 616. According to some embodiments of the present disclosure, the cross-sections of the plurality of first contacts 605 and/or the plurality of vias 606, 607 included in the outer seal ring structure 601 and the plurality of first contacts 611 and/or the plurality of vias 612, 613 included in the inner seal ring structure 602 may be ring-shaped vias from a top view. The contour of the ring-shaped vias may be substantially similar to the ring-shaped contour of the first contacts 205 and/or the plurality of vias 206, 207 illustrated in FIG. 2-2. The details are not described again herein to avoid repetition. In some embodiments, the contour of the ring-shaped vias may be substantially similar to the ring-shaped contour of the outer seal ring structure 601 and the inner seal ring structure 602.

In some embodiments, the first contacts 605 included in the outer seal ring 601 are embedded in the interlayer dielectric layer 211 and contact the doped region 204 of the substrate 201. The vias 606, 607, and the first metal layers 608, 609, and 610 included in the outer seal ring 601 are embedded in the inter-metal dielectric layer 212, wherein the first metal layers 608, 609, and 610 are electrically connected with each other by the vias 606, 607. In some embodiments, the bottommost first metal layer 608 directly contacts the first contacts 605.

In some embodiments, the first contacts 611 included in the inner seal ring 602 are embedded in the interlayer dielectric layer 211 and contact the doped region 204 of the substrate 201. The vias 612, 613, and the second metal layers 614, 615, and 616 included in the inner seal ring 602 are embedded in the inter-metal dielectric layer 212, wherein the second metal layers 614, 615, and 616 are electrically connected with each other by the vias 612, 613. In some embodiments, the bottommost second metal layer 614 directly contacts the first contacts 611. Furthermore, as shown in FIG. 6A, one layer of the first metal layers 608, 609, and 610 and a corresponding layer of the second metal layers 614, 615, and 616 (e.g. the first metal layer 608 corresponding to the second metal layer 614) are in direct contact with the same one of the block-shaped connecting portions 603. In some embodiments, the distance between the edge of chip region 101 adjoin the seal ring region 103 and the edge of the second metal layer 614 of the inner seal ring structure 602 adjoin the chip region 101 is the third distance D3. In some embodiments, the third distance D3 is not less than 10 um, such as in a range from about 10 um to about 100 um.

In some embodiments, the materials and the formation methods of the first contacts 605, 611 and the vias 606, 607, 612, and 613 are substantially the same as those of the first contact 205 and the vias 206, 207 illustrated in FIG. 2A-1. The details are not described again herein to avoid repetition. In some embodiments, the materials and the formation methods of the first metal layers 608, 609, and 610 and the second metal layers 614, 615, and 616 are substantially the same as those of the metal layers 208, 209, and 210 illustrated in FIG. 2A-1. The details are not described again herein to avoid repetition. In some embodiments, the materials and the formation methods of the block-shaped connecting portions 603 are substantially the same as those of the metal layers 208, 209, and 210 illustrated in FIG. 2A-1. The details are not described again herein to avoid repetition.

In some embodiments, one layer of the first metal layers 608, 609, and 610 and a corresponding layer of the second metal layers 614, 615, and 616 (e.g. the first metal layer 608 corresponding to the second metal layer 614, the first metal layer 609 corresponding to the second metal layer 615, and so on) can be formed simultaneously in the same process for forming the metal layer. The block-shaped connecting portions 603 corresponding to the first metal layer and the second metal layer can also be formed simultaneously in the same process.

As shown in FIG. 6A, in some embodiments, the passivation layer 213 is disposed on the inter-metal dielectric layer 212 and covers the outer seal ring structure 601 and the inner seal ring structure 602. The passivation layer 213 can protect the underlying layers and provide physical isolation and structural support. In some embodiments, an opening O can be formed in the passivation layer 213 to expose a portion of the block-shaped connecting portions 603 between the outer seal ring structure 601 and the inner seal ring structure 602. When performing the dicing process in the scribe line region 102, the opening O can reduce the transfer of external stress to the seal ring region 102.

Subsequently, please refer to FIG. 6B. FIG. 6B is a cross-sectional diagram along the line segment B-B' shown in FIG. 6. The cross-sectional structure illustrated in FIG. 6B is substantially the same as the cross-sectional structure illustrated in FIG. 6A, and the difference is that the cross-sectional diagram in FIG. 6B do not include the block-shaped connecting portion 603. Thus, the opening O of the passivation layer 213 exposes the inter-metal dielectric layer 212.

According to FIGS. 6, 6A, and 6B, the semiconductor structures 600 provided in the embodiments of the present disclosure includes the outer seal ring structure 601, the inner seal ring structure 602, and the block-shaped connecting portions 603 in the seal ring region 103. The H-shaped ring structure, formed by connecting the outer seal ring structure 601 and the inner seal ring structure 602 by the block-shaped connecting portions 603, can prevent mechanical damage of the die during the dicing process and prevent the invasion of moisture and chemical contaminants. In addition, the H-shaped ring structure has a certain cushioning effect which can effectively increase the affordable stress value of the seal ring structure and thereby protect the dies.

Please refer to FIG. 7. FIG. 7 is a top-view diagram illustrating a portion of an exemplary semiconductor structure 700, according to yet other embodiments of the present disclosure. As shown in FIG. 7, the semiconductor structure 700 includes a chip region 101, a seal ring region 103 surrounding the chip region 101, and a scribe line region 102 surrounding the seal ring region 103. The seal ring region 103 includes an H-shaped ring structure and second seal ring structures 105, 106. In some embodiments, the H-shaped ring structure is formed by connecting the outer seal ring structure 601 and the inner seal ring structure 602 by the block-shaped connecting portions 603. From a top view, according to some embodiments of the present disclosure, the second seal ring structures 105, 106 surround the chip region 101, and the H-shaped ring structure surrounds the second seal ring structures 105, 106.

Figure 7A:
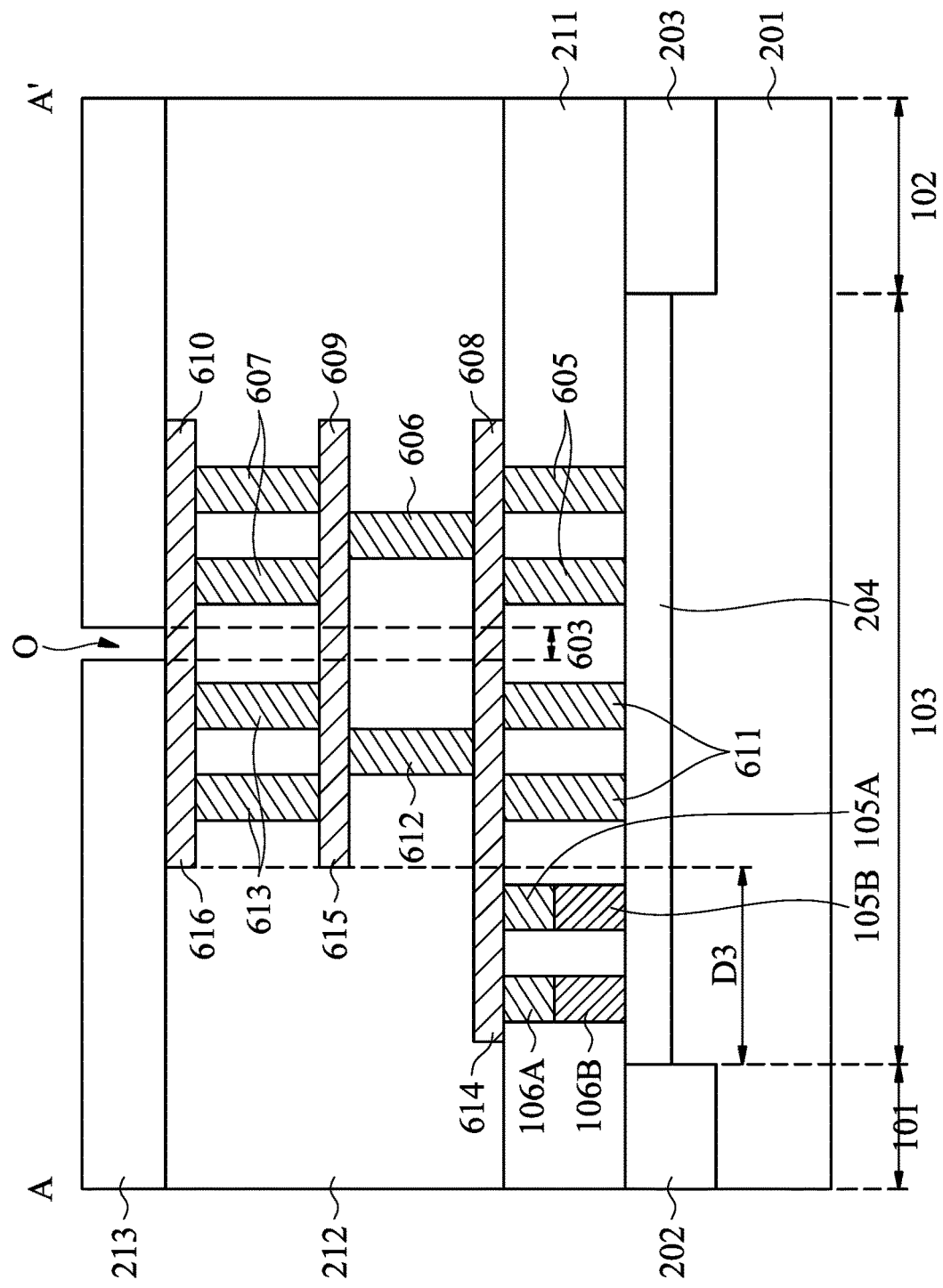
FIG. 7A is a cross-sectional diagram illustrating a semiconductor structure along the line segment A-A' shown in FIG. 7 according to yet other embodiments of the present disclosure.

Subsequently, please refer to FIG. 7 along with FIG. 7A. FIG. 7A is a cross-sectional diagram along the line segment A-A' shown in FIG. 7. It should be noted that FIG. 7A does not illustrate all of the elements of a semiconductor 700 for the purpose of simplicity and clarity. The cross-sectional structure illustrated in FIG. 7A is substantially the same as the cross-sectional structure illustrated in FIG. 6A, and the difference is that the cross-sectional structure illustrated in FIG. 7A includes the second contacts 105A, 106A and the polysilicon ring structures 105B, 106B included in the second seal ring structures 105, 106. In some embodiments, the details regarding materials and the formation methods of the second contacts 105A, 106A and the polysilicon ring structures 105B, 106B can be found in the description of FIG. 2A-2. The details are not described again herein to avoid repetition. In some embodiments, the distance between the edge of chip region 101 adjoin the seal ring region 103 and the edge of the second metal layer 615 of the inner seal ring structure 602 adjoin the chip region 101 is the third distance D3. In some embodiments, the third distance D3 is not less than 10 um, such as in a range from about 10 um to about 100 um.

Figure 8:
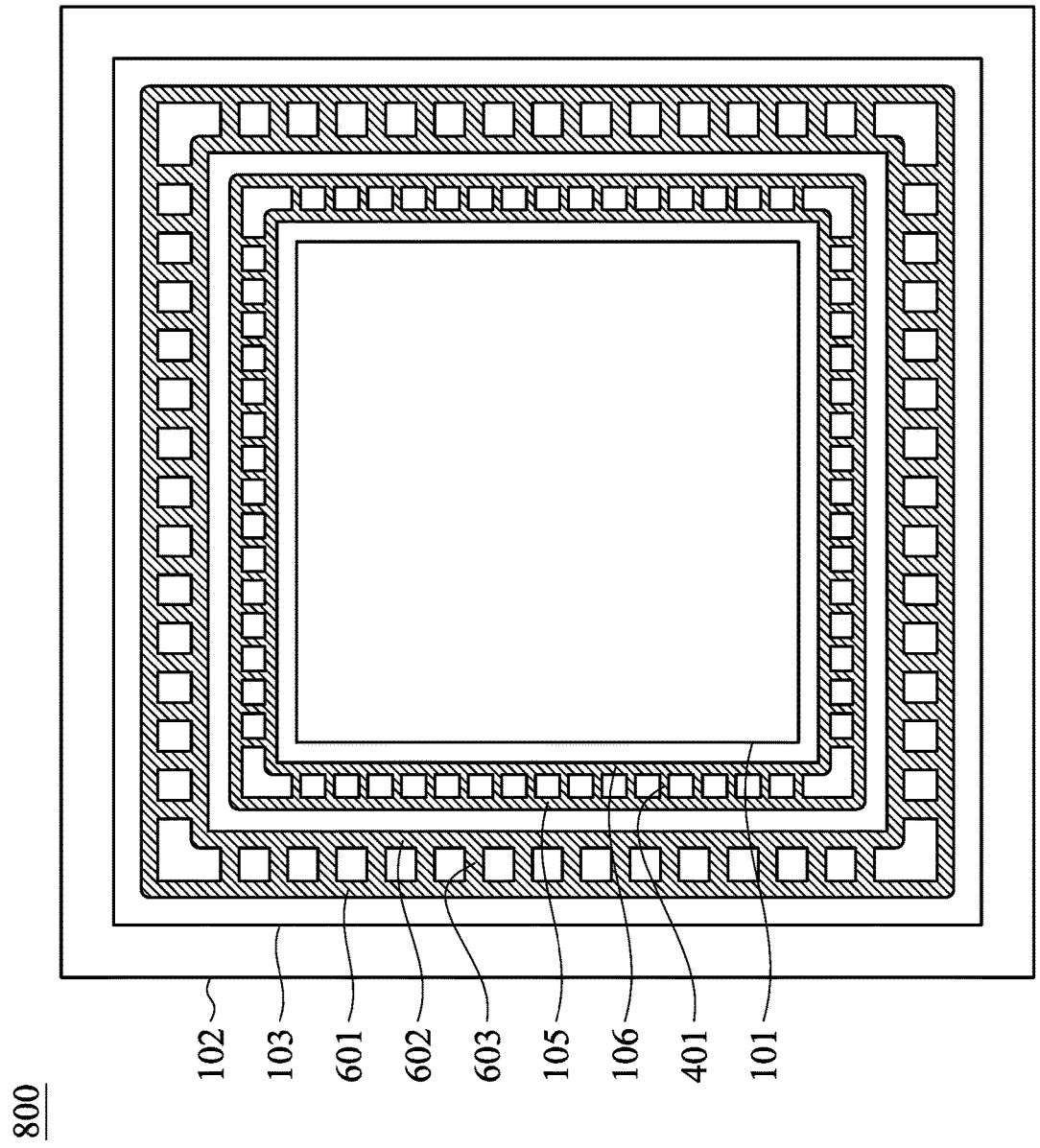
FIG. 8 is a top-view diagram illustrating a portion of an exemplary semiconductor structure according to other embodiments of the present disclosure.

FIG. 8 is a top-view diagram illustrating a portion of an exemplary semiconductor structure 800, according to other embodiments of the present disclosure. In some embodiments, the semiconductor structure 800 illustrated in FIG. 8 is substantially the same as the semiconductor structure 700 illustrated in FIG. 7, and the difference is that the polysilicon ring structures 105B, 106B included in the second seal ring structures 105, 106 are connected to each other by a plurality of block-shaped connecting portions 401 to form an H-shaped ring structure. In some embodiments, the block-shaped connecting portions 401 are formed of polysilicon, and the block-shaped connecting portions 401 and the polysilicon ring structures 105B, 106B are formed simultaneously in the same process. By the arrangement of the H-shaped ring structure of the second seal ring structures 105, 106, the second seal ring structures 105, 106 may be firmer. The contact area between the second sealing ring structures 105, 106 and the interlayer dielectric layer 211 can be increased, and thereby better mechanical strength can be provided and the cushioning effect to prevent the internal stress and external stress around the chip region can be enhanced.

Figure 9:
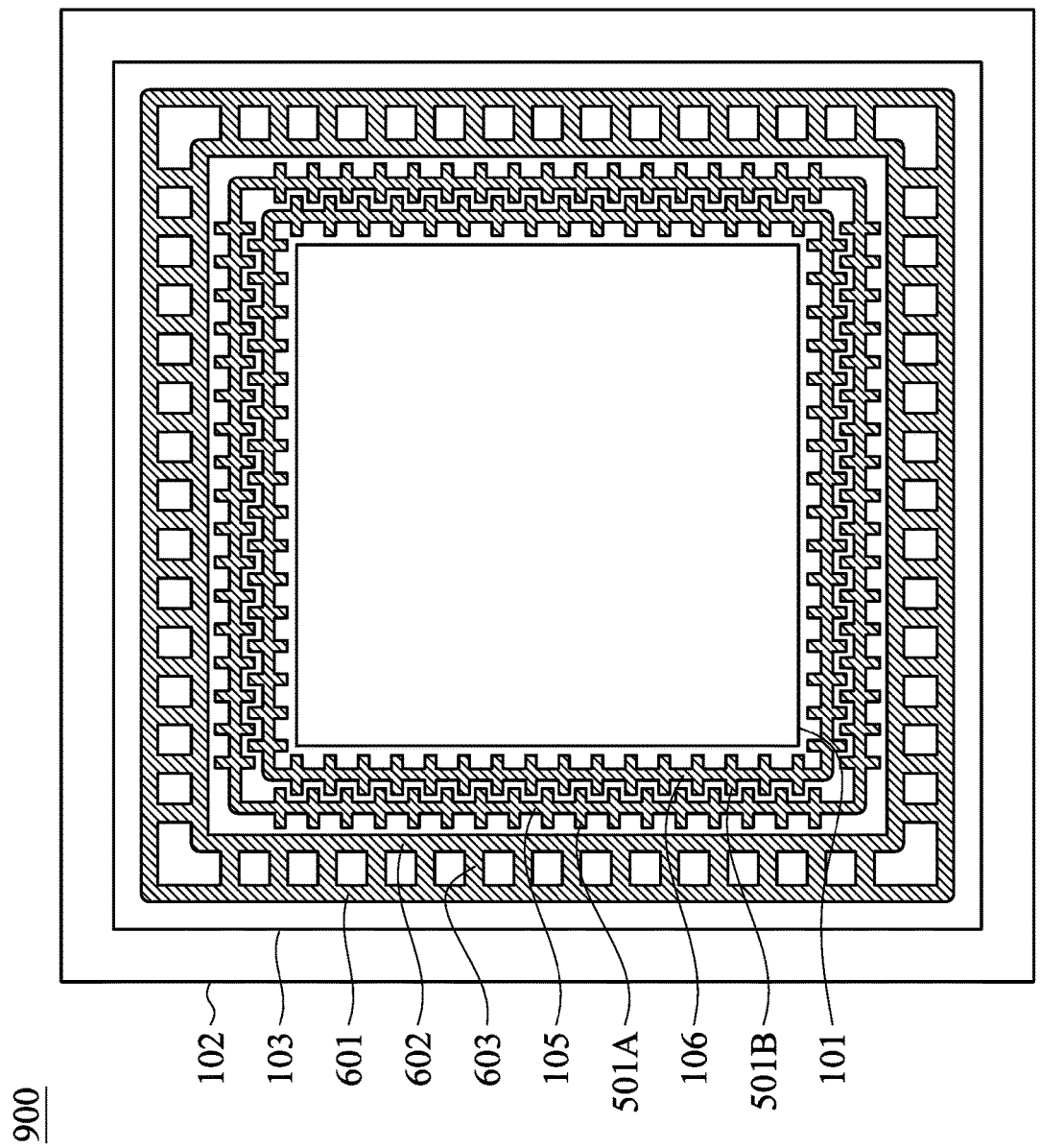
FIG. 9 is a top-view diagram illustrating a portion of an exemplary semiconductor structure according to other embodiments of the present disclosure.

FIG. 9 is a top-view diagram illustrating a portion of an exemplary semiconductor structure 900, according to other embodiments of the present disclosure. In some embodiments, the semiconductor structure 900 illustrated in FIG. 9 is substantially the same as the semiconductor structure 700 illustrated in FIG. 7, and the difference is that the polysilicon ring structure 105B included in the second seal ring structure 105 of the semiconductor structure 900 has a plurality of protruding portions 501A, and the polysilicon ring structure 106B included in the second seal ring structure 106 of the semiconductor structure 900 has a plurality of protruding portions 501B. The protruding portions 501A protrude beyond two opposite sides of the polysilicon ring structure 105B, and the protruding portions 501B protrude beyond two opposite sides of the polysilicon ring structure 106B. The protruding portions 501A and the protruding portions 501B are arranged in a staggered order. In some embodiments, the protruding portions 501A, 501B are formed of polysilicon, and the protruding portions 501A, 501B and the polysilicon ring structures 105B, 106B are formed simultaneously in the same process. By the arrangement of the polysilicon ring structures 105B, 106B having protruding portions 501A, 501B included in the second seal ring structures 105, 106, the contact area between the second sealing ring structures 105, 106 and the interlayer dielectric layer 211 can be increased, and thereby the isolation and the cushioning effect to prevent the internal stress and external stress around the chip region can be enhanced.

According to FIGS. 7-9, the semiconductor structures 700, 800, and 900 respectively includes H-shaped ring structure and polysilicon ring structures 105B, 106B in the seal ring region. By the shapes, structures, and arrangements of the polysilicon ring structure and the H-shaped ring structure, formed by connecting the outer seal ring structure 601 and the inner seal ring structure 602 by the block-shaped connecting portion 603, can prevent mechanical damage of the die during the dicing process and prevent the invasion of moisture and chemical contaminants. Therefore, the protection that the seal ring structure provides to the dies can be effectively enhanced and thereby increase the effective active area of the chip region within the seal ring structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a substrate having a chip region and a seal ring region;
a first insulating layer disposed on the substrate;
a second insulating layer disposed on the first insulating layer;
a first seal ring structure disposed in the seal ring region and embedded in the first insulating layer and the second insulating layer, wherein the first seal ring structure comprises a stack of metal layers;
a second seal ring structure disposed in the seal ring region and embedded in the first insulating layer, wherein the second seal ring structure comprises a polysilicon ring structure; and
a passivation layer disposed on the second insulating layer and the first seal ring structure;
wherein from a top view, the seal ring region surrounds the chip region, wherein the second seal ring structure surrounds the chip region and the first seal ring structure surrounds the second seal ring structure.

2. The semiconductor structure as claimed in claim 1, wherein the first insulating layer is an interlayer dielectric layer, and the second insulating layer is an inter-metal dielectric layer.

3. The semiconductor structure as claimed in claim 1, wherein the stack of metal layers comprises:
a plurality of first contacts embedded in the first insulating layer and contacting a doped region in the substrate; and
a plurality of metal layers embedded in the second insulating layer electrically connected to each other through a plurality of vias, wherein a bottommost layer of the plurality of metal layers is electrically connected to the plurality of first contacts.

4. The semiconductor structure as claimed in claim 1, wherein the polysilicon ring structure and a gate structure in the chip region are in a same level.

5. The semiconductor structure as claimed in claim 1, wherein the polysilicon ring structure comprises at least two polysilicon layers and a dielectric layer disposed between the polysilicon layers.

6. The semiconductor structure as claimed in claim 1, wherein the polysilicon ring structure is disposed on an isolation structure in the substrate.

7. The semiconductor structure as claimed in claim 3, wherein the second seal ring structure further comprises a second contact, wherein the second contact is disposed on the polysilicon ring structure and only embedded in the first insulating layer, and the second contact and the plurality of first contacts directly contact the bottommost layer of the plurality of metal layers.

8. The semiconductor structure as claimed in claim 7, wherein the plurality of first contacts and/or the plurality of vias comprised in the stack of metal layers are ring-shaped, and the second contact is ring-like shape composed of discrete holes from a top view.

9. The semiconductor structure as claimed in claim 1, wherein the second seal ring structure further comprises a plurality of polysilicon ring structures, and a distance between the plurality of polysilicon ring structures is in a range from about 0.2 um to about 10 um.

10. The semiconductor structure as claimed in claim 9, wherein the plurality of polysilicon ring structures are connected to each other by a plurality of block-shaped connecting portions to form an H-shaped ring structure.

11. The semiconductor structure as claimed in claim 9, wherein from a top view, each of the plurality of polysilicon ring structures has a plurality of protruding portions which protrude beyond two opposite sides of a corresponding one of the plurality of polysilicon ring structures, and the plurality of protruding portions of different ones of the plurality of polysilicon ring structures are arranged in a staggered order.

12. The semiconductor structure as claimed in claim 1, wherein a distance between an edge of the chip region and the first seal ring structure is not less than 10 um.

13. A semiconductor structure, comprising:
a substrate having a chip region and a seal ring region;
an insulating layer disposed on the substrate;

an outer seal ring structure disposed in the seal ring region and embedded in the insulating layer, wherein the outer seal ring structure comprises a stack of first metal layers;

an inner seal ring structure disposed in the seal ring region and embedded in the insulating layer, wherein the inner seal ring structure comprises a stack of second metal layers; and a passivation layer disposed on the outer seal ring structure and the inner seal ring structure;

wherein from a top view, the seal ring region surrounds the chip region, wherein the inner seal ring structure surrounds the chip region and the outer seal ring structure surrounds the inner seal ring structure, and the outer seal ring structure and the inner seal ring structure form an H-shaped ring structure by a plurality of block-shaped connecting portions.

14. The semiconductor structure as claimed in claim 13, wherein the stack of first metal layers comprises:
 a plurality of first contacts contacting a doped region in the substrate; and
 a plurality of first metal layers electrically connected to each other through a plurality of first vias, wherein a bottommost layer of the plurality of first metal layers directly contacts the plurality of first contacts.

15. The semiconductor structure as claimed in claim 14, wherein the stack of second metal layers comprises:
 a plurality of second contacts contacting the doped region in the substrate; and
 a plurality of second metal layers electrically connected to each other through a plurality of second vias, wherein a bottommost layer of the plurality of second metal layers directly contacts the plurality of second contacts;
 wherein a layer of the plurality of first metal layers is electrically connected to a corresponding one of the plurality of second metal layers through one of the plurality of block-shaped connecting portions.

16. The semiconductor structure as claimed in claim 13, wherein the passivation layer has an opening which exposes a part of the plurality of block-shaped connecting portions.

17. The semiconductor structure as claimed in claim 13, wherein from a top view, widths of the outer seal ring structure and the inner seal ring structure are in a range from about 0.2 um to about 10 um.

18. The semiconductor structure as claimed in claim 13, wherein from a top view, a width of the plurality of block-shaped connecting portions is in a range from about 0.2 um to about 10 um.

19. A semiconductor structure, comprising:
 a substrate having a chip region and a seal ring region;
 a first insulating layer disposed on the substrate;
 a second insulating layer disposed on the first insulating layer;
 an outer seal ring structure disposed in the seal ring region and embedded in the first insulating layer and the second insulating layer, wherein the outer seal ring structure comprises a stack of first metal layers;
 an inner seal ring structure disposed in the seal ring region and embedded in the first insulating layer and the second insulating layer, wherein the inner seal ring structure comprises a stack of second metal layers, wherein the outer seal ring structure and the inner seal ring structure form an H-shaped ring structure by a plurality of block-shaped connecting portions;
 a polysilicon ring structure disposed in the seal ring region and embedded in the first insulating layer; and
 a passivation layer disposed on the second insulating layer, the outer seal ring structure, and the inner seal ring structure;
 wherein from a top view, the seal ring region surrounds the chip region, wherein the polysilicon ring structure surrounds the chip region, and the H-shaped ring structure surrounds the polysilicon ring structure.

20. The semiconductor structure as claimed in claim 19, wherein the polysilicon ring structure and a gate structure in the chip region are in a same level.

21. The semiconductor structure as claimed in claim 19, wherein the polysilicon ring structure comprises at least two polysilicon layers and a dielectric layer disposed between the polysilicon layers.

22. The semiconductor structure as claimed in claim 19, further comprising an additional polysilicon ring structure, wherein the plurality of polysilicon ring structures are connected to each other by a plurality of polysilicon connecting portions to form an H-shaped polysilicon ring structure from a top view.

23. The semiconductor structure as claimed in claim 19, further comprising an additional polysilicon ring structure, wherein each of the plurality of polysilicon ring structures has a plurality of polysilicon protruding portions which protrude beyond two opposite sides of a corresponding one of the plurality of polysilicon ring structures, and the plurality of protruding portions of different ones of the plurality of polysilicon ring structures are arranged in a staggered order from a top view.

* * * * *